United States Patent [19]
McArdle et al.

[11] Patent Number: 5,851,644
[45] Date of Patent: Dec. 22, 1998

[54] FILMS AND COATINGS HAVING ANISOTROPIC CONDUCTIVE PATHWAYS THEREIN

[75] Inventors: Ciaran B. McArdle; Joseph Burke, both of Dublin, Ireland

[73] Assignee: Loctite (Ireland) Limited, Dublin

[21] Appl. No.: 686,987

[22] Filed: Jul. 25, 1996

[51] Int. Cl.[6] .............................. B32B 7/02; B32B 5/16; H01B 1/06; H01C 1/06

[52] U.S. Cl. ......................... 428/213; 428/323; 428/329; 428/900; 252/503; 252/506; 252/510; 252/511; 252/512; 252/62.51; 252/62.52; 252/62.53; 252/62.54; 252/62.55; 252/62.56

[58] Field of Search .................................. 428/900, 323, 428/328, 329, 356, 213; 252/510, 503, 506, 511, 512, 62.51, 62.52, 62.53–62.56

[56] References Cited

U.S. PATENT DOCUMENTS

| | | | |
|---|---|---|---|
| 2,718,506 | 9/1955 | Elleman | 252/513 |
| 3,359,145 | 12/1967 | Salyer et al. | 156/1 |
| 3,580,776 | 5/1971 | Shenfil et al. | 156/275 |
| 3,661,744 | 5/1972 | Kehr et al. | 204/159.14 |
| 3,843,540 | 10/1974 | Reimers et al. | 252/62.51 |
| 3,898,349 | 8/1975 | Kehr et al. | 427/36 |
| 3,917,538 | 11/1975 | Rosensweig | 252/62.52 |
| 4,008,341 | 2/1977 | Kehr | 427/44 |
| 4,092,376 | 5/1978 | Douek et al. | 260/884 |
| 4,100,088 | 7/1978 | Haas et al. | 252/62.52 |
| 4,170,677 | 10/1979 | Hutcheson | 428/119 |
| 4,215,209 | 7/1980 | Ray-Chaudhuri | 526/292 |

(List continued on next page.)

FOREIGN PATENT DOCUMENTS

| | | | |
|---|---|---|---|
| 0208391 | 1/1987 | European Pat. Off. | H01F 1/28 |
| 0232127 | 8/1987 | European Pat. Off. | H01R 4/04 |
| 0299618 | 1/1989 | European Pat. Off. | H01F 1/28 |
| 0330452 | 8/1989 | European Pat. Off. | C09J 7/02 |
| 0402546 | 12/1990 | European Pat. Off. | H05K 3/12 |
| 0549159 | 6/1993 | European Pat. Off. | H01R 4/04 |
| 0691660 | 1/1996 | European Pat. Off. | H01B 1/22 |

(List continued on next page.)

OTHER PUBLICATIONS

Berglund, R.N. et al., "Generation of Monodisperse Aerosol Standards", *Environmental Sci. and Tech.* 7(2) p. 147 1973.

Wu, H.F. et al., "Effect of Surfactant Treatments on Interfacial Adhesion in Single Graphite/Epoxy Composite"s, *Polymer Composites* 12(4), 281, 1993.

Rao, A.V. et al., "Evolution of Polymerisable Surfactants", *Paint and Ink Int'l* 15, 1995.

Holmberg, K., "Novel Surfactants for Paints", *Surface Coatings Int'l* (12) 481, 1993.

Kim, "Two– and Three– Dimensional Crystalization of Polymeric Microspheres by Micromolding in Capillaries", *Advanced Materials*, 8(3), 245–247, 1996.

(List continued on next page.)

*Primary Examiner*—Cathy Lam
*Attorney, Agent, or Firm*—Vidas, Arrett & Steinkraus P.A.

[57] ABSTRACT

An anisotropically-conductive film or a substrate having a surface coated with an anisotropically-conductive coating, said film or coating being formed by solidifying a composition comprising (i) a solidifiable ferrofluid composition, the ferrofluid comprising a colloidal suspension of ferromagnetic particles in a non-magnetic carrier, and (ii) a plurality of electrically-conductive particles, dispersed in the ferrofluid, the electrically-conductive particles having been arrayed in a non-random pattern by application of a substantially uniform magnetic field to the composition in a liquid state and having been locked in position by solidification of the composition. The composition is solidified in an A-stage, usually involving a primary cure. In end-use application of the film or coating, the composition usually undergoes a B-stage or secondary cure. The film or coated substrate is an article of manufacture for bonding conductors in the electronics industry.

18 Claims, 9 Drawing Sheets

U.S. PATENT DOCUMENTS

| | | | |
|---|---|---|---|
| 4,368,131 | 1/1983 | Rosenweig | 252/62.55 |
| 4,430,239 | 2/1984 | Wyman | 252/62.51 |
| 4,548,862 | 10/1985 | Hartman | 428/323 |
| 4,604,229 | 8/1986 | Raj et al. | 252/510 |
| 4,606,962 | 8/1986 | Reylek et al. | 428/148 |
| 4,644,101 | 2/1987 | Jin et al. | 178/18 |
| 4,645,611 | 2/1987 | Campbell et al. | 252/62.51 |
| 4,687,596 | 8/1987 | Borduz et al. | 252/510 |
| 4,698,907 | 10/1987 | Soszek | 29/846 |
| 4,701,276 | 10/1987 | Wyman | 252/62.52 |
| 4,737,112 | 4/1988 | Jin et al. | 439/66 |
| 4,740,657 | 4/1988 | Tsukagoshi et al. | 174/88 |
| 4,741,850 | 5/1988 | Wyman | 252/62.52 |
| 4,808,638 | 2/1989 | Steinkraus et al. | 522/24 |
| 4,846,988 | 7/1989 | Skjeltorp | 252/62.52 |
| 4,855,079 | 8/1989 | Wyman | 252/62.52 |
| 4,867,910 | 9/1989 | Meguro et al. | 252/519 |
| 4,935,147 | 6/1990 | Ullman et al. | 210/695 |
| 4,938,886 | 7/1990 | Lindsten et al. | 252/62.51 |
| 4,946,613 | 8/1990 | Ishikawa | 252/62.52 |
| 4,963,220 | 10/1990 | Bachmann | 156/307.3 |
| 4,965,007 | 10/1990 | Yudelson | 252/62.53 |
| 4,992,190 | 2/1991 | Shtarkman | 252/62.52 |
| 5,064,550 | 11/1991 | Wyman | 252/62.52 |
| 5,075,034 | 12/1991 | Wanthal | 252/511 |
| 5,076,950 | 12/1991 | Ullman et al. | 252/62.51 |
| 5,084,490 | 1/1992 | McArdle et al. | 522/181 |
| 5,085,789 | 2/1992 | Yokouchi et al. | 252/62.52 |
| 5,104,582 | 4/1992 | Lindsten et al. | 252/513 |
| 5,124,060 | 6/1992 | Yokouchi et al. | 252/62.51 |
| 5,128,215 | 7/1992 | Pendergrass, Jr. | 428/694 |
| 5,141,970 | 8/1992 | McArdle et al. | 522/170 |
| 5,147,573 | 9/1992 | Chagnon | 252/62.52 |
| 5,167,850 | 12/1992 | Shtarkman | 252/62.52 |
| 5,169,471 | 12/1992 | Strasser | 156/272.4 |
| 5,180,888 | 1/1993 | Sugiyama et al. | 174/94 |
| 5,221,417 | 6/1993 | Basavanhally | 156/629 |
| 5,346,558 | 9/1994 | Mathias | 148/23 |
| 5,349,478 | 9/1994 | Sato et al. | 360/55 |
| 5,366,140 | 11/1994 | Koskenmaki et al. | 228/246 |
| 5,382,373 | 1/1995 | Carlson et al. | 252/62.55 |
| 5,429,701 | 7/1995 | Lu | 156/272.4 |
| 5,438,223 | 8/1995 | Higashi et al. | 257/774 |
| 5,453,148 | 9/1995 | Lu et al. | 156/272.2 |
| 5,486,427 | 1/1996 | Koskenmaki et al. | 428/546 |
| 5,522,962 | 6/1996 | Koskenmaki et al. | 156/272.4 |
| 5,543,397 | 8/1996 | Drauz et al. | 514/19 |

FOREIGN PATENT DOCUMENTS

| | | | |
|---|---|---|---|
| 940077 | 1/1994 | Ireland . | |
| 940078 | 1/1994 | Ireland . | |
| 54-14193 | 2/1979 | Japan | G09F 9/30 |
| 62-127194 | 6/1987 | Japan . | |
| 3095298 | 4/1991 | Japan | C10M 169/04 |
| 6-122857 | 5/1994 | Japan | C09J 9/02 |
| 919502 | 2/1963 | United Kingdom . | |
| 2 053 493 | 2/1981 | United Kingdom | G01R 33/02 |
| 93/01248 | 1/1993 | WIPO | C09J 163/00 |
| 95/18476 | 7/1995 | WIPO | H01R 13/24 |
| 95/20820 | 8/1995 | WIPO | H01F 1/44 |

OTHER PUBLICATIONS

Williams et al, "The Effects of Conducting Particle Distribution on the Behaviour of Anistropic Conducting Adhesives: Non–Uniform Conductivity and Shorting Between Connections", *Journal of Electronics Manufacturing*, 3, 85–94, 1993.

Hogerton, "Development Goals and Present Status of 3M's Adhesive Interconnection Technology", *Journal of Electronics Manufacturing*, 3, 191–197, 1993.

Ogunjimi, "A Review of the Impact of Conductive Technology on Interconnection", *Journal of Electronics Manufacturing*, 2, 109–118, 1992.

Liu, "Applications of Anistropically Conductive Adhesives and Films as Surface Mount Solder Joints Substitute—a Survey", *IVF–Internal Report* 91/04, 32–36.

Skjeltorp, A.T., "One– and Two– Dimensional Crystallization of Magnetic Holes", *Physical Review Letters*, 51(25) 2306–2309, 19 Dec. 1983.

Skjeltorp, A.T., "Colloidal Crystals in Magnetic Fluid", *Conference on Magnetism & Magnetic Materials*, 163–164, Nov. 1983.

Skjeltorp, A.T., "Ordering Phenomena of Particles Dispersed in Magnetic Fluids", *Journal of Applied Physics*, 57(1), 3285–3289, 15 Apr. 1985.

Skjeltorp, A.T., "Monodisperse Particles and Ferrofluids: A Fruit–fly Model System", *Journal of Magnetism and Magnetic Materials*, 65, 195–203, 1987.

Rosensweig, "Magnetic Fluids", *Annual Review of Fluid Mechanics*, 19, 437–63, 1987.

Soszek, "Two Novel Additive Processes to Create Circuitry: Direct Laser Writing and Direct Electrostatic Transfer Deposirtion", *Circuit World*, 19(4), 12–15, 1993.

Skeltorp A.T. et al., "Condensation and Ordering of Colloidal Spheres Dispersed in a Ferrofluid", *Physica* A 176, 37, 1991.

Ferromagnetic Materials, Wohlfarth, E.P. ed., vol. 2, ch. 8, p. 509 Charles, S.W., Popplewell, J., *Martinet A. Elsevier Sci. Publishing Co.* 1983.

"Aggregation Processes in Solution", Wyn–Jones, E., Gormally, J. Ch. 18, p. 509.

Li and Morris, "Structure and Selection Models for Anisotropic Conductive Adhesive Films", *First Int'l Conference on Adhesive Joining Technology in Electronics* Mfr., Berlin, Nov. 1994.

Shaw, "Chemistry and Technology of Epoxy Resins", B. Ellis ed., ch. 7 p. 206, *Blackie Academic and Professional*, 1993.

Shiozawa, "Electric Properties of Connections by Anisotropic Conductive Film", *First Int'l Conf. on Adhesive Joining Technology in Electronics* Mfr., Berlin, Nov. '94.

Lyons & Dahringer, *Handbook of Adhesives Technology*, Pizzi & Mittal, eds., p. 578, 1994.

Nakao Y., "Preparation and Characterization of Noble Metal Sols in Poly(methly methacrylate)", *J. Chem. Soc. Chem. Commun.* 826, 1993.

Nakao Y. & Kaeriyama K., "Preparation of Noble Metal Sols in the Presence of Surfactants and thie Properties", *J. Colloid Interface Sci.* 110(1), 82, 1986.

Klabunde et al., "Colloidal Metal Particles Dispersed in Monomeric and Polymeric Styrene and Methyl Methacrylate", *Chemistry of Materials* 1, 481, 1989.

Cardenas T., G., "Synthesis and Molecular Weights of Metal (Styrene–Methyl Methacrylate) Copolymer. III", *Polymer Bull.* 27, 383, 1992.

Cardenas, G., "Synthesis and Molecular Weights of of Metal Polyacrylonitriles", *Polymer Bull.* 26, 611, 1991.

Rios P. et al., "Poly(butadiene–acrylic acid(g)acrylonitrile-(g)acrylic acid)", *Polymer Bull.* 31, 293–296, 1993.

Popplewell J. et al., "Microwave Properties of Ferrofluid Composites", *J. Magnetism and Magnetic Materials* 54–57, 761, 1986.

Kopcansky P., "The Observation of Various Structures of Magnetic Particles and Magnetic Holes in Ferrofluids", *Acta Phys. Slov.* 39(4), 259, 1989.

Jin et al, "Anisotropically Conductive Polymer Films With a Uniform Dispersion of Particles", *IEEE Transactions on Components, Hybrids and Manufacturing Technology*, 16(8), Dec. 1993, 972–977.

Holman, "Pilot Plant Helps Ablestik in Development of Specialized Tapes", *Adhesives Age*, Jan. 1995, 30–31.

Hitachi Chemical Data Sheet, Specification of Anisolm AC 6073 (Date unknown).

ThreeBond Co. Brochure, ThreeBond 3370 "Anisotropically Electroconductive Adhesive Film" (Date unknown).

ThreeBond Co. Brochure, "ThreeBond 3300 Series, Conductive Resin, Adhesive, Paste and Coating Material" (Date unknown).

Skjeltorp, "Colloidal Crystals in Magnetic Fluid", *Journal of Applied Physics*, 55(6), pt.2B, 2587-8, 1984.

IBM Technical Disclosure Bulletin, 17(6), 1842–43, Nov. 1974.

Babiarz, "Chip Size Packaging", Advanced Packaging, May/Jun. 1995.

Derwent Abstract 88–114223/17 Date WPIL 211 Apr. 27, 1988.

Derwent Abstract 88–113862/17 Date Apr. 27, 1988.

Derwent Abstract 87–032270/05 Date Dec. 18, 1986.

Derwent Abstract 87–018716/03 Date Dec. 8, 1986.

Derwent Abstract 87–018508/03 Date Dec. 6, 1986.

Dyno Particles Brochure on polymer particles, Oct. 1991.

McArdle et al., N"ovel Uniaxial Conductive Adhesives Polymerisable Ferrofluids and Conductive Magnetic Holes", *Proc. Adhesives in Electronics*, Stockholm, Sweden, Jun. 3–5, 1996.

Author unknown, "Fluid Has World's Highest Magnetic Flux Density", *J. Electronic Engineering*, 27 (280), 64–66, Apr. 1990.

Derwent Abstract Secondary Accession C89–048416 Date unknown Mar. 1, 1989.

Derwent Abstract 87–196399/28 Date Jun. 9, 1987.

Derwent Abstract 86–314250/48 Date Oct. 15, 1986.

Derwent Abstract 68–97057P/00 Date Dec. 19, 1967.

Derwent Abstract 82–55954E/27 Date May 28, 1982.

Derwent Abstract AN 86–261618 Date Aug. 23, 1986.

Reactive Surfactants and Reactive Protective Colloids—Brochure (May 1, 1996).

Reilly, J. O. et al., Anisotropic Adhesive Progress Report, Apr. 5, 1993.

Ferrofluidics Corporation Technology Note, Date Unknown.

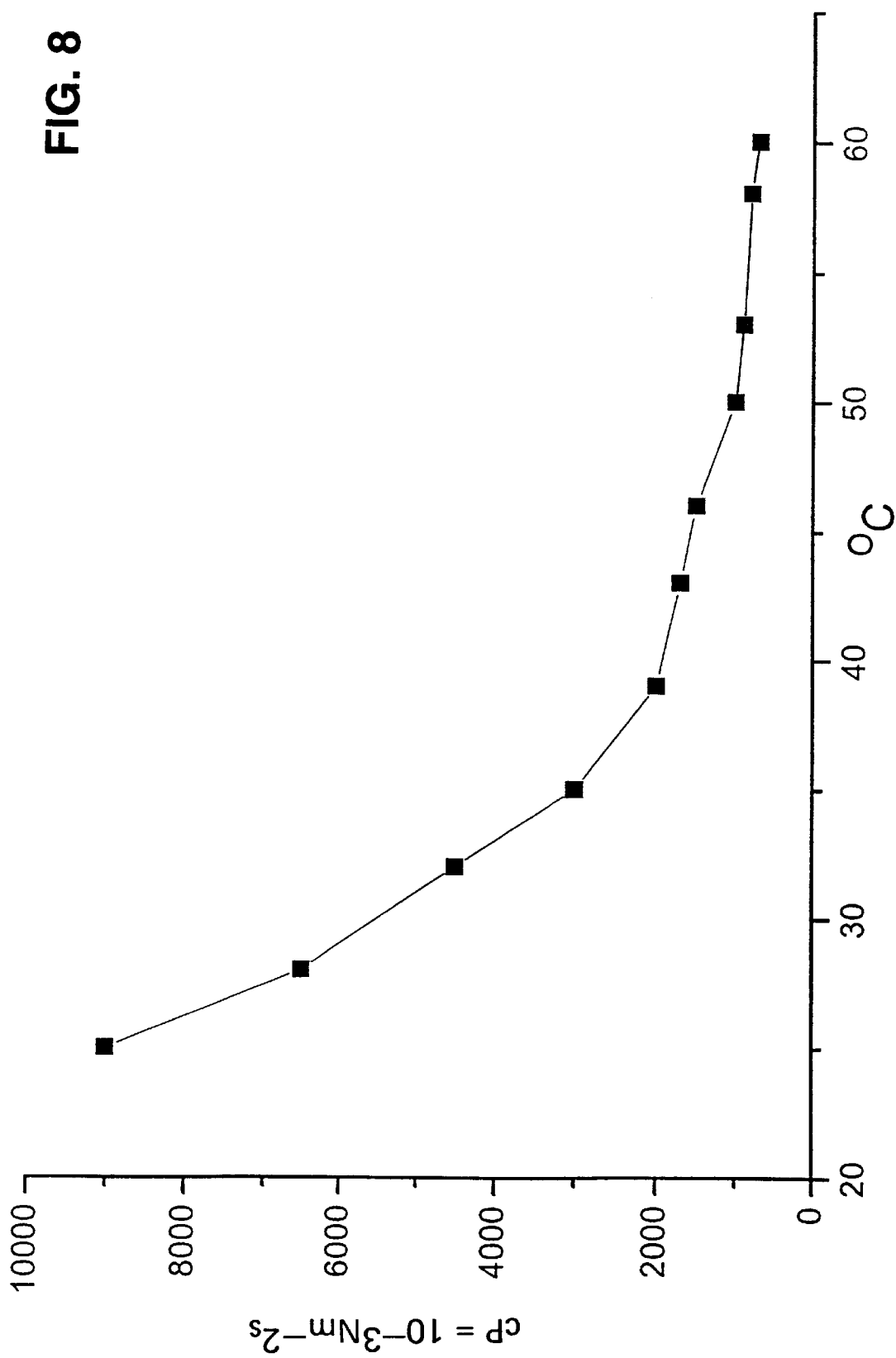

FILMS AND COATINGS HAVING ANISOTROPIC CONDUCTIVE PATHWAYS THEREIN

BACKGROUND OF THE INVENTION

1. Field of the Invention

This invention relates to films and coatings having anisotropic conductive pathways therein, and to methods for making the films and coatings, and to electronic components having such a coating thereon. The invention is particularly for use in interconnection technology in the electronics industry.

2. Description of Related Art

Electronic components such as semiconductor chips, circuit boards, flex connectors and displays often have very small connectors such as pad, pins and leads and have minimal gaps (pitch) between connectors. Conventional solder may give rise to difficulties because the solder may bridge the gap between two adjacent connectors on the same component. Therefore anisotropically-conductive adhesives have been proposed for electrical interconnection. An anisotropically conductive adhesive (ACA) conducts electricity in one direction only (usually denoted as the Z direction) and should eliminate conduction in the plane perpendicular thereto (the X and Y directions).

Various proposals for ACA's are reviewed by Ogunjimi et al in Journal of Electronics Manufacturing (1992) 2, 109–118 and are described in U.S. Pat. No. 4,740,657 Tsukagoshi et al; 3,359,145 Salyer et al; 4,548,862 Hartman; 4,644,101 Jin et al; 4,170,677 Hutcheson and 4,737,112 Jin et al.

Jin et al in IEEF Trans. on Components, Hybrids and Manufacturing Technology, Vol. 16, (8), 1993, p. 972 (the contents of which are incorporated herein by reference) describes anisotropically conductive films consisting of a single layer of magnetically separated conductor spheres in a polymer matrix. In a vertical magnetic field, ferromagnetic spheres in a viscous medium become parallel magnetic dipoles, and repel one another to produce a two-dimensional particle distribution which is described as uniform. This structure is then frozen in by cooling or curing of the polymer matrix, which may be an elastomer or an epoxy or thermoplastic adhesive.

ACAs rendered anisotropic by application of a magnetic field have not been adopted commercially, so far as the present Applicants are aware. The proposals by Jin et al (which date back to 1986, as shown by U.S. Pat. No. 4,737,112) require specialized particles which are both magnetic and electrically conductive. Magnetic particles which have been distributed by a magnetic field may form undesirable dendritic protrusions, which can only be circumvented by balancing magnetic force on the particles with surface tension of the polymer and gravity effects. Such dendritic structures are undesirable for interconnection in the electronics field, where the distribution of conductive pathways is critical. Ordering magnetic particles in a regular adhesive matrix therefore imposes restraints with regard to particle type (ferromagnetic), field strength and matrix properties. Ferromagnetic conductive particles such as Fe, Ni, and Co tend to have high densities, low compressibility, are prone to settling out of formulations and are either toxic or easily corroded. It is therefore undesirable to use them as interconnection particles.

Hogerton in Journal of Electronics Manufacturing (1993) 3, 191–197 (the contents of which are incorporated herein by reference) discusses the status of 3M's adhesive interconnection technology, with particular emphasis on anisotropically conductive adhesive films. Hogerton indicates that a new film construction will avoid the inherent limitations of random dispersion of conductive particles and will provide for direct adhesive flip-chip attachment of unbumped integrated circuits. However the new film construction is not disclosed.

In an unrelated area of technology, it is known to make a magnetic liquid or "ferrofluid" consisting of a colloidal suspension of minute ferromagnetic particles in a non-magnetic carrier liquid. A typical ferrofluid may consist of magnetite particles ($Fe_3O_4$) having a particle size in the range 2 nanometres to 0.1 micrometres (and a mean size of about 0.01 micrometres) in kerosene as carrier liquid with a surfactant to prevent agglomeration of the particles (see Skjeltorp "One- and Two-Dimensional Crystallization of Magnetic Holes" in Physical Review Letters, Volume 51, Number 25, 19 Dec. 1983, 2306–2309, Skjeltorp A. T. and Helgesen, G. Physica A, 176, 37, 1991; Skjeltrop A. T. J. Appl. Physics 57(1), 3285, 1985); and U.S. Pat. No. 4,846,988 Skjeltrop, the contents of which are incorporated by reference.

U.S. Pat. No. 5,075,034 Wanthal describes a two component adhesive composition which is curable by induction heating (i.e. with an induced magnetic field) and which contains conductive carbon black along with iron oxide particles. However there is no suggestion that the iron oxide particles may be of such small particle size as to form a colloidal suspension. This patent therefore does not relate to the field of ferrofluids or of anisotropically conductive adhesives.

EP 0 208 391 A2 Ferrofluidics Corporation describes an electrically conductive ferrofluid composition which contains carbon particles having diameters of about 5 to 30 nm. The composition is intended for use in a ferrofluid exclusion seal apparatus for sealing of computer disk drive spindles.

JP 3095 298 Nippon Seiko KK describes a magnetic fluid composition containing fine ferromagnetic particles and fine particles of at least one metal, alloy or electrically conductive ceramic as a material which imparts electrical conductivity. The conductive particles have a diameter distributed within the range of a few nm to a few hundred nm while in the case of anisotropic particles the length of the longer particles may be a few tens of nm.

In a further unrelated area of technology, U.S. Pat. No. 4,946,613 Ishikawa describes a photosetting ferrofluid for use in magnetic flaw detection or for visualizing magnetically recorded patterns. The photosetting ferrofluid comprises a carrier, a ferrofluid in which the ferromagnetic particles have an adsorbed surfactant (or the surfactant is dispersed in the carrier) and a photosetting resin. The photosetting resin may be the carrier. The ferrofluid is applied to a surface to be analyzed and is then subjected to a magnetic field. The applied ferrofluid will be attracted to the portion where the magnetic flux leaks i.e. to cracks or defects in the surface, and will swell to form a pattern corresponding to the configuration of the defect portion. A beam of light is then used to set or harden the photosetting resin so as to fix the defect pattern thus formed.

Ishikawa does not envisage the application of a magnetic field to create a chosen alignment of particles, followed by fixation of this alignment.

In International Patent Publication No. WO 95/20820 (hereafter called "the parent application", the contents of which are incorporated herein by reference) published after the priority date of this application, we have described a composition comprising: (i) a ferrofluid comprising a colloidal suspension of ferromagnetic particles in a non-magnetic carrier liquid, and (ii) a plurality of electrically-conductive particles having substantially uniform sizes and shapes, dispersed in the ferrofluid.

Preferably the average particle size of the electrically conductive particles is at least 10 times (and more particularly 100 times, most preferably 500 times) that of the colloidal ferromagnetic particles. The non-magnetic carrier liquid may be curable or non-curable and may be selected from:

(i) a curable liquid composition, (ii) a mixture of a curable liquid composition and a liquid carrier in which the ferromagnetic particles have been suspended, and (iii) a non-curable carrier liquid, but if the carrier liquid is non-curable and the curable liquid composition is not present, the electrically-conductive particles have a latent adhesive property.

In the parent application we have also described a method of making an anisotropically-conductive bond between two sets of conductors, comprising:

(a) applying to one set of conductors a layer of an adhesive composition comprising a curable composition as described above;

(b) bringing a second set of conductors against the layer of adhesive composition;

(c) exposing the layer of adhesive composition to a substantially uniform magnetic field such that interaction between the ferrofluid and the electrically-conductive particles causes the electrically-conductive particles to form a regular pattern of particles each in electrical contact with an adjacent particle and/or with a conductor in one or both sets whereby conductive pathways are provided from one set of conductors to the other set, each pathway comprising one or more of the electrically-conductive particles; and (d) curing the composition to lock the pattern in position and to bond the conductors.

The parent application further describes a method of making an anisotropically conductive bond between two sets of conductors, comprising:

(a) applying to one set of conductors a layer of a non-curable composition as described above wherein the electrically-conductive particles have a latent adhesive property;

(b) bringing a second set of conductors against the layer of the composition;

(c) exposing the layer of the composition to a substantially uniform magnetic field such that interaction between the ferrofluid and the electrically-conductive particles causes the electrically-conductive particles to form a regular pattern of particles each in contact with an adjacent particle and/or with a conductor of one or both sets; and (d) activating the latent adhesive property of the particles whereby conductive pathways are provided from one set of conductors to the other set, each pathway comprising one or more of the electrically-conductive particles, and the conductors are bonded by the particles.

In a preferred feature of the invention of the parent application, pressure is applied to urge the respective sets of conductors towards one another before and/or during the curing step or the activation of the latent adhesive property.

SUMMARY OF THE INVENTION

It may not always be convenient to install a means for creating a magnetic field at the location of assembly of two sets of conductors. It is therefore an object of the present invention to provide other ways of achieving the benefits of the invention of the parent application. It is a further object of the invention to provide films or coatings which overcome the limitations of random dispersion of conductive particles, as discussed in the Hogerton paper cited above, and which do not have the disadvantages of the Jin et al technology using magnetically separated conductor spheres.

The present invention provides an anisotropically-conductive film or a substrate having a surface coated with an anisotropically-conductive coating, said film or coating being formed by solidifying a composition comprising:

(i) a solidifiable ferrofluid composition, the ferrofluid comprising a colloidal suspension of ferromagnetic particles in a non-magnetic carrier, and (ii) a plurality of electrically-conductive particles, dispersed in the ferrofluid, said electrically-conductive particles having been arrayed in a non-random pattern by application of a substantially uniform magnetic field to the composition in a liquid state and having been locked in position by solidification of the composition.

Furthermore, the present invention provides a solid-form anisotropically-conductive or a substrate having a surface coated with a solid-form anisotropically-conductive coating, said film or coating comprising a composition containing colloidal ferromagnetic particles and a plurality of electrically-conductive particles arrayed in a non-random pattern.

The present invention provides either a film as defined above, or a substrate having a surface coated with a coating as defined above, as a stock material or article of manufacture. The term "film or coating" used herein means a film or coating which is formed so as to have at least one accessible major surface. This surface can be applied against an electronic component to achieve electrical interconnection. The accessible surface may be protected by a removable release sheet or cover sheet. The film may suitably be in sheet form or roll form. The term "film or coating" does not cover a layer which is formed in situ between two conductors to bond them together, as described in the parent application.

The term "ferromagnetic" as used herein includes ferrimagnetic materials such as ferrites.

The non-magnetic carrier liquid may suitably be solidifiable or non-solidifiable. The term "solidifiable" as used herein means capable of existing as a solid at ambient temperatures e.g. temperatures less than 40° C., more usually 20°–30° C. Solidifiable compositions include curable compositions which cure to solid form by exposure to an energy source e.g. heat treatment, electromagnetic radiation, or otherwise, hardenable compositions, compositions which solidify as a result of solvent evaporation, and thermoplastic compositions which are heat-softenable but which revert to solid form on cooling. The word "solid" as used herein means stable in shape and includes a gel or polymer network. Preferably the composition is curable and it includes a primary cure system and/or a secondary cure system.

The invention also provides a method of forming an anisotropically-conductive film or substrate coating which comprises:

(a) applying to a substrate, a layer of a composition comprising:

(i) a solidifiable ferrofluid composition, the ferrofluid comprising a colloidal suspension of ferromagnetic particles in a non-magnetic carrier liquid, and (ii) a plurality of electrically-conductive particles dispersed in the ferrofluid, (b) exposing the liquid composition to a magnetic field to array the electrically-conductive particles in a non-random pattern, and (c) concurrent with or subsequent to step (b), exposing the composition to solidifying conditions for the composition, and (d) optionally removing the layer of solid composition from the substrate to form a film.

The non-magnetic carrier may be solid at room temperature but may be heated during application to the substrate and/or exposure to the magnetic field.

In one embodiment the film or coating may not be required to have adhesive properties, if for example it is to be used between two sets of conductors which are to be assembled temporarily for test purposes but which are not to be bonded. However generally it is preferred that the composition contains a secondary or latent adhesive/cure system, the secondary or latent adhesive/cure system being activatable in end-use application of the film or coating.

The exercise of the present invention generally involves two stages, an A-stage and a B-stage. The A-stage, or primary solidification has the function of locking the array of electrically conductive particles in position and producing a film or coating which is capable of being handled, either when unsupported or at least when supported. The A-stage may suitably involve a primary cure e.g. by photocure, heat, or E-beam. Solvent evaporation, cooling (in particular from a melt), chemical reaction (e.g. polymerization), physical assocation phenomena etc., are also acceptable means of effecting viscosity increases to an effectively solid A-staged condition following ordering in an initial fluid state. The B-stage which occurs during end-use application of the film or coating, may utilize thermoplastic properties of the A-staged film or coating but preferably involves a cure, for example to a thermoset condition. When the A-stage solidification has been effected by a primary cure, the B-stage cure is a secondary cure which may utilize the same or a different cure system from that of the A-stage.

In one embodiment of the invention, the composition is applied to the substrate, and is then exposed to the magnetic field. In another embodiment of the invention, the composition is exposed to the magnetic field while the composition is being applied to the substrate. The composition may be applied continuously or step-wise. Likewise the substrate may pass continuously or step-wise pass the apparatus applying the magnetic field.

In one embodiment the composition is applied to the substrate by stenciling or screen printing using stenciling or screen printing equipment having one or more magnets mounted appropriately on it.

The substrate may be rigid or flexible. A release layer may form the substrate and/or may be applied to the layer of composition on the face remote from the substrate. The release layer may be rigid or flexible.

The present invention includes a substrate, preferably an active or passive electronic component, having conductors on its surface or periphery and having a coating as described above applied to its conductors.

According to one aspect of the invention, the coating may be applied to an electronic component, more particularly a silicon wafer, as the substrate. The base wafer with metallized patterns delineated thereon is coated with a composition as described above, particularly an epoxy coating which can be rendered dry to the touch. The electrically-conductive particles are arrayed in a regular pattern by exposure to a uniform magnetic field and the coating is cured (primary cure). Alternatively a preformed "patch" of film according to the invention is applied to the wafer. In either case, the composition contains a latent thermal hardener so that it has latent adhesive properties. The resulting product, when subdivided into chips, can be used for "flip chip" attachment.

Preferably the average particle size of the electrically-conductive particles is at least 10 times that of the colloidal-size ferromagnetic particles, more particularly at least 100 times, most preferably at least 500 times. Most suitably the electrically-conductive particles have an average particle size (measured on the minor dimension in the case of non-symmetrical particles) of at least 2 micrometres while the colloidal ferromagnetic particles have an average particle size not greater than 0.1 micrometres, more preferably of the order of 0.01 micrometres.

The interconnection pads generally have a width in the range of 10 to 500 micrometres, particularly of the order of 100 micrometres. The separation between the pads generally is less than 150 micrometres, particularly of the order of 100 micrometres. However it is aimed to reduce the separation below 100 micrometres, even down to 10 micrometres or less. The present invention facilitates such pitch or separation reduction.

In the preferred embodiments, the electrically-conductive particles are arrayed in a regular pattern in a monolayer.

Preferably the electrically-conductive particles have substantially uniform sizes and shapes. Substantial uniformity is not affected by the presence of some smaller than average particles (which may not function as conductive particles in the film) or some larger than average particles (which may be compressible and/or otherwise capable of size reduction in the conditions of production of the film or coating e.g. solder particles which may or deform). The size distribution for solder powder particles is defined according to test methods of the Institute for Interconnecting and Packaging Electronic Circuits, Lincolnwood, Ill. 60646–1705, U.S.A. For example, under their test method IPC-TM-650, the following distributions are quoted:

TABLE 2B

| | % of Sample by Weight - Nominal Size in micrometers | | | |
|---|---|---|---|---|
| | None Larger Than | Less than 1% Larger Than | 90% Minimum Between | 10% Maximum Less Than 1 |
| Type 4 | 40 | 38 | 38–20 | 20 |
| Type 5 | 30 | 25 | 25–15 | 15 |
| Type 6 | 20 | 15 | 15–5 | 5 |

The term "solidifiable ferrofluid composition" used herein includes:

(1) a colloidal dispersion of ferromagnetic particles in a solidifiable liquid composition (i.e the solidifiable composition acts as the carrier of the ferrofluid), or (2) a mixture of a solidifiable liquid composition and a colloidal dispersion of ferromagnetic particles in a liquid carrier.

Preferably in the above-described methods the composition is cured or otherwise solidified while the magnetic field is applied or shortly after removal from the field.

In one feature of the invention, pressure may be applied to the layer of composition before and/or during the primary curing or other solidification step.

According to another preferred feature of the present invention, the thickness of the film or coating is substantially equal to or slightly less than the average diameter of the electrically-conductive particles. During exposure to the magnetic field, the thickness of the layer of composition may suitably be greater than the average diameter of the electrically-conductive particles, preferably not more than twice the said average diameter, so that each particle is surrounded by the carrier liquid and is free to move in the layer of the composition. After the particles have been ordered by the magnetic field, pressure may be applied to the layer of the composition to reduce the thickness so that the electrically-conductive particles lie at or protrude slightly from both surfaces of the film or coating. Alternatively, if compression is omitted, the thickness of the layer of composition may be reduced by shrinkage during the A-stage, e.g. as a result of cure or drying. If the particles are compressible spheres, the thickness of the film or coating may be reduced by compression to less than the average diameter of the electrically-conductive particles so that the particles are compressed into a non-circular cross-sectional shape and the area of electrical contact on the surface of each particle is increased. Compression of individual particles to different degrees of compression may also compensate for some variations in particle size and flatness of the substrates. Electrically-conductive particles having a core of polymeric material coated with an electrically-conductive metal will have a degree of compressibility dependent upon the extent of cross-linking of the polymer. Gold-coated spherical polystyrene particles supplied by Sekisui Fine Chemical Co, Osaka, Japan under the name AU 212, (which were found to have an average diameter of 11.5 micrometres) compressed on the Z-axis under 3.3 MPa pressure were found to have a Z-axis dimension of 10.5 micrometres i.e. an aspect ratio (Z/X) of 0.79 corresponding to an 8.7% contraction on the Z-axis.

In one embodiment, the magnetic field is applied normal to the layer of the composition (i.e. in the Z direction) and the electrically-conductive particles form a regular array of particles in a monolayer or in columns, depending on the thickness of the layer. With a monolayer there is primarily single-particle bridging in the Z direction between two sets of conductors (when the film or coating is used between two sets of conductors). The regular pattern improves the reliability of electrical contact. In a second embodiment the magnetic field is applied parallel to the layer of the composition (i.e. the X direction) and the electrically-conductive particles form parallel chains of particles, each in electrical contact with an adjacent particle or particles of the same chain. The chains are formed to lie parallel to the longitudinal axis of two sets of conductor pins or tracks. Here again, single-particle bridging in the Z-direction is achieved between the two sets of conductors but the particles are also in electrical contact with adjacent particles in the same chain so that reliability is further improved. In a case where two separate sets of conductor pins or tracks are located on opposite edges of an integrated circuit or other component, the layer of the composition will normally be interrupted at a central area of the component so that no conductive chain of particles extends across the width of the component to connect the two sets of conductors on the same component (unless in a special case this is desired). In the case of a "quad" component having conductor pins on four edges, with two sets at right angles to the other two sets, the layer of the composition is applied, exposed to the magnetic field and cured or activated in two steps, so that chains of conductive particles are formed in the X-direction and Y-direction with the appropriate alignments and interruptions in the respective areas.

With the embodiment which uses a magnetic field normal to the layer of the composition, no significant alignment in the X-direction or Y-direction occurs, so that no interruption of the layer of the composition or double alignment step is needed.

The colloidal ferromagnetic particles of the ferrofluid are preferably magnetite but other ferromagnetic particles may also be used as described in U.S. Pat. No. 4,946,613 Ishikawa the contents of which are incorporated herein by reference. Exemplary ferromagnetic particles include: (i) ferromagnetic oxides such as manganese ferrites other than magnetite, cobalt ferrites, barium ferrites, metallic composite ferrites (preferably selected from zinc, nickel and mixtures thereof), and mixtures thereof; and (ii) ferromagnetic metals selected from iron, cobalt, rare earth metals and mixtures thereof. A ferrite is a ceramic iron oxide compound having ferromagnetic properties with a general formula $MFe_2O_4$ where M is generally a metal such as cobalt, nickel or zinc (Chambers Science and Technology Dictionary, W. R. Chambers Ltd. and Cambridge University Press, England, 1988). The phenomenon of ferrimagnetism is observed in ferrites and similar materials. However they are included within the definition of ferromagnetic particles in this and the parent application.

The ferromagnetic particle diameter may be in the range 2 nanometres to 0.1 micrometres, preferably with a mean particle size of about 0.01 micrometres. The ferromagnetic particle content may suitably comprise from 1 to 30% by volume of the curable ferrofluid adhesive composition. In the case where a monomer forms the carrier of the ferrofluid, the suspension of ferromagnetic particles in the monomer may suitably have a particle content of 2–10% by volume.

A surfactant will generally be required for stably dispersing the ferromagnetic particles in the carrier. Surfactants may be selected from unsaturated fatty acids and salts thereof wherein the fatty acid or salt has one or more polar groups such as $COOH$, $SO_3H$, $PO_3H$ and mixtures thereof, or other surfactants well known in the art such as silicone type surfactants, fluorine type surfactants and the like. Suitable surfactants include Sodium oleate, or oleic acid, silane coupling agents such as that available under the Trade Mark SH-6040 from Toray Silicone Co. Ltd., Saloosinate LH from Nikko Chem. Co. Ltd, the fluorine containing surfactant X C95-470 from Toshiba Silicone Co. Ltd. Primary surfactants form an adsorbed coating on the surface of the ferromagnetic particles. In some circumstances a secondary surfactant may also be required, to achieve satisfactory dispersion, particularly an anionic surfactant, for example an acid form of a phosphate ester, particularly an aromatic phosphate ester type surfactant such as GAFAC RE610 from GAF (Great Britain) Limited, Wythenshawe, Manchester, U.K. or RHODAFAC RE610 from Rhone-Poulenc Chimie, France.

A suitable non-magnetic carrier liquid may be chosen from among those described in U.S. Pat. No. 4,946,613 Ishikawa, U.S. Pat. No. 3,843,540 Reimers or WO 95/20820 of the present Applicants, the contents of which are incorporated herein by reference. The carrier may suitably be an organic soluent selected from (a) hydrocarbons such as liquid fractions of intermediate boiling range such as kerosene and fuel oils, n-pentane, cyclohexane, petroleum ether, petroleum benzine, benzene, xylene, toluene and mixtures thereof; (b) halogenated hydrocarbons such as chlorobenzene, dichlorobenzene, bromobenzene and mixtures thereof; (c) alcohols such as methanol, ethanol, n-propanol, n-butanol, isobutanol, benzylalcohol and mixtures thereof; (d) ethers such as diethyl ether, diisopropyl ether and mixtures thereof; (e) aldehydes such as furfural and mixtures thereof; (f) ketones such as acetone, ethyl methyl ketone and mixtures thereof; (g) fatty acid such as acetic acid, acetic anhydride and mixtures thereof and derivatives thereof; and (h) phenols, as well as mixtures of the various solvents. Reviews on ferrofluids have been provided by various authors (Ferromagnetic Materials, Wohlfarth E. P. (Ed), Vol 2 Chpt 8, p509—Charles S. W. and Popplewell J., North Holland Publishing Co. 1980; Aggregation Processes in Solution, Wyn-Jones E., Gormally, J. Chpt 18, p509, Martinet A Elsevier Sci. Publishing Co. 1983; Rosensweig R. E. Ann. Rev. Fluid Mech. 19, 437–463, 1987). Commercially available ferrofluids such as those from Ferrofluidics Corp. NH, USA comprise dispersed magnetizable particles in suitable carriers, the most common of which are water, esters, flurocarbons, polyphenylethers and hydrocarbons.

Typical properties of standard ferrofluids and further characteristics of exemplary ferrofluids are given in the parent application.

The ferrofluids are normally effective insulators. The resistivity of a ferrofluid adhesive composition is likely to be further increased after curing.

The solidifiable composition is preferably an adhesive composition and may be any suitable monomer composition into which the ferrofluid can be mixed or in which the colloidal magnetic particles can be dispersed. Numerous polymerizable systems based on acrylate, epoxide, siloxane, styryloxy, vinyl ether and other monomers, oligomers, prepolymers such as polyimides and cyanate ester resins and/or polymers and hybrids thereof may be used. Traditional anisotropically conductive adhesive films have for example been described by Emori and Tasaka in WO 93/01248 based on cyanate ester resins in conjunction with thermoplastic resin additives. The adhesive may be selected from olefinically unsaturated systems such as acrylates, methacrylates, styrene, maleate esters, fumarate esters, unsaturated polyester resins, alkyl resins, thiol-ene compositions, and acrylate, methacrylate, or vinyl terminated resins including silicones and urethanes. Suitable acrylates and methacrylates are those used in polymerizable systems such as disclosed in U.S. Pat. No. 4,963,220 of Bachmann et al and U.S. Pat. No. 4,215,209 of Ray-Chaudhuri et al. Also preferred are methylmethacrylate, polyfunctional methacrylates, silicone diacrylates and polyfunctional acrylated urethanes of the type known to be useful in formulating adhesives (e.g. as disclosed in U.S. Pat. No. 4,092,376 of Douek et al or a thiol-ene (e.g. as disclosed in U.S. Pat. Nos. 3,661,744, 3,898,349, 4,008,341 or 4,808,638). Suitable epoxy systems are included among those described in "Chemistry and Technology of Epoxy Resins", ed. B. Ellis, Blackie Academic and Professional, 1993, London, Chapter 7 P.206ff. F. T Shaw. Suitable Styryloxy systems are as disclosed in U.S. Pat. Nos. 5,543, 397, 5,084,490 and 5,141,970. The contents of all the above-mentioned patents and text are incorporated herein by reference. In the case wherein the solidification process exploits the resolidication of a molten matrix material, suitable matrices include polyamide hot melt adhesive polymers, Uni-Rez(R) 2642 and Uni-Rez(R) 2665, which are commercially available from Union Camp Corporation in Savannah, Ga., and polyester polymers, Vitel(R) 1870 and Vitel(R) 3300, which are commercial available from Shell Chemical Co in Arkon, Ohio. These materials have been disclosed by Mathias U.S. Pat. No. 5,346,558 in traditional solderable anisotropically conductive compositions and methods for using the same. One proviso applied to the adhesive system is that it is either compatible with a commercially available ferrofluid or else is capable of acting as a carrier for the suitably treated magnetically polarizable particles which are used in the making of a ferrofluid. The monomer composition may be curable by free radical, anaerobic, photoactivated, air-activated, heat-activated, moisture-activated, instant or other cure systems such as the addition of hardeners to resins. One cure system may be utilized in the A-stage or primary solidification, and a second cure system may be utilized in the B-stage.

The monomer composition may comprise two polymerizable systems, one of which cures wholly or partially in the A-stage or primary solidification, and the second of which cures in the B-stage (accompanied by further curing of the first system, if appropriate). A hybrid monomer, for example an epoxy acrylate, may be used.

The electrically-conductive particles may be magnetic; although the magnetic field will be applied directly to such particles, the presence of the ferrofluid contributes to a more structured pattern of aligned magnetic electrically-conductive particles than would be achieved if the particles were dispersed in a composition without the ferrofluid.

However it is a preferred feature of the present invention that the electrically-conductive particles should be substantially non-magnetic.

The term "non-magnetic" as used herein means that each particle has no significant net magnetic dipole. A particle with a non-magnetic core may have a coating of a metal (such as nickel) which is ferromagnetic in nature but in view of the small volume of the coating the net magnetic moment per unit volume of the particle is not significant. The substantially non-magnetic particles do not respond to magnetic fields in environments which themselves are not susceptible to magnetic fields, for example a non-ferromagnetic liquid medium.

The electrically-conductive particles may suitably have a size in the range 1–300 micrometres. Spherical particles are preferred but other spheroidal shapes, elongated shapes, cylindrical shapes, regular shapes such as cubic, or fibrous structures may also be used. For spherical particles a diameter in the range 2–100 micrometres, more particularly 2–50 micrometres, especially 5–30 micrometres and more especially 5–20 micrometres, is preferred, while for particles having a major dimension and a minor dimension the major dimension is preferably in the range 2–300 micrometres and the minor dimension is preferably in the range 2–100 micrometres, particularly 2–50 micrometres, especially 5–30 micrometres, and more especially 5–20 micrometres the aspect ratio preferably being in the range 15/1 to 1/1, more preferably 10/1 to 1/1. In the case of fibrous structures an aspect ratio of up to 50/1 may be acceptable but fibres are less preferred because of the danger of cross-contact causing incorrect interconnection between conductors, particularly in a thin layer of composition. Suitable particles may have a non-magnetic non-conductive core, for example of plastics material such as polystyrene, or of glass, coated with an electrically-conductive metal such as nickel, silver or gold. A core of conductive material such as graphite or a metal may be used. The core may optionally be hollow. Particles of carbon fibre or solder may also be used.

U.S. Pat. No. 5,346,558 Mathias describes solder powder whose particle size is less than 37 micrometres and preferably less than 15 micrometres. WO 93/1248 Emori et al describes a superfine solder powder, average diameter 10 micrometres available from Nippon Atomizer.

The electrically-conductive particles form electrically-conducting inclusions in the ferrofluid composition which is an insulator. Application of a magnetic field to the ferrofluid composition causes interactions between the colloidal ferromagnetic particles and the non-magnetic conductive particles so that they are mutually stabilized in a non-random structural pattern (with chain formation where the appropriate dimension of a layer of the composition so permits) due to attractive interactions between particles and repulsive interaction between chains. In effect there is a driving force to move the conductive elements relative to the insulating elements so that the two systems are in mutually exclusive zones (see Skjeltorp, Physical Review Letters, Op.cit.).

The concentration of electrically-conductive particles in the composition is chosen according to the desired spacing between those particles in the ordered array and other factors. With spherical particles of about 2 micrometres diameter, a concentration in a monolayer of $10^7$ particles per square centimetre may be suitable. A qualitative concentration in the range 0.5–60%, by weight of the composition may also be suitable. See also U.S. Pat. No. 5,366,140 Koskenmaki et al., the contents of which are incorporated herein by reference, particularly at column 2 lines 22 to 26, which quotes average densities of about 600–6,000,000 microbeads/$cm^2$, most preferably 160,000–6,000,000 beads/$cm^2$. Optimum concentrations of conductive particles depend upon a number of factors that can be determined by those skilled in the art through simple experimentation and/or mathematical calculations. Skjeltorp (U.S. Pat. No. 4,846, 988) notes that the concentration of magnetic holes in ferrofluids polarized with a magnetic field, determines the distance between them. Shiozawa et. al. (1st International Conference on Adhesive Joining Technology in Electronics Manufacturing, Berlin, November 1994) indicates that contact resistance in traditional anisotropically conductive adhesives decreases as particle count (per unit area) increases. The larger the number of conductive particles, the greater the current carrying capacity. The current carrying capabilities are not only concentration dependent but also particle type dependent (Lyons and Dahringer in "Handbook of Adhesives Technology, Pizzi and Mittal (eds), Marcel Dekker Inc 1994, p.578).

Thus the actual concentration of conductive particles will depend on the particle type, density, diameter, electrical pattern, minimum required contact resistance measurements, the spacing between opposing and adjacent conductors, the surface area of the conductors, etc.

Li and Morris (1st International Conference on Adhesive Joining Technology in Electronics Manufacturing, Berlin, November 1994) have developed computer programs that calculate the minimum pad size for different loading densities and the minimum pad space for different particle sizes of conductive particles in conductive adhesives. The magnetic field may be applied by a permanent magnet or by electromagnetic means. A preferred magnetic field is in the range 10 mT to 1000 mT, more preferably 10 mT to 100 mT, applied for a time in the range 0.1 to 10 minutes, more preferably 0.5 to 5 minutes.

The film or coating according to the invention is intended for use in electrical interconnection of active and/or passive electronic components, for example chip-on-board, chip-on-flex, chip-on-glass and board/flex and flex/glass. The invention is particularly suited for interconnection of fine-pitch sets of conductors and for "flip-chip" technology.

BRIEF DESCRIPTION DRAWINGS

Embodiments of the invention will now be described by way of example. Certain examples are supported by drawings. In the drawings.

Figure 5:
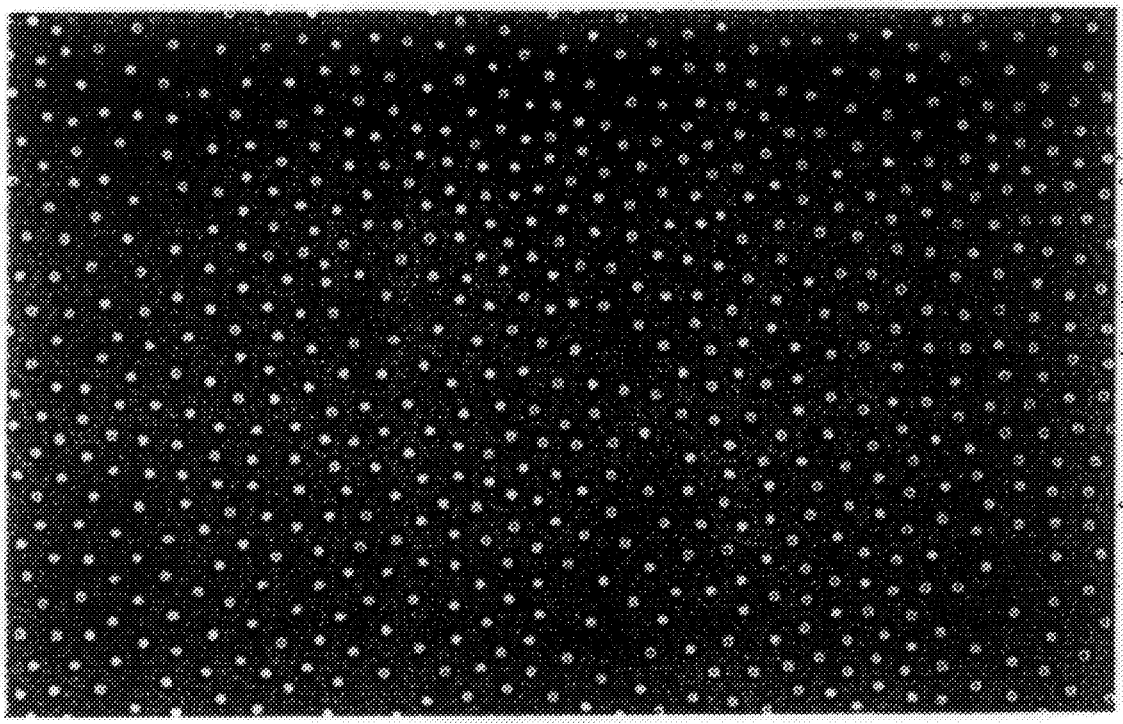

FIG. 5 is an optical photomicrograph of the coating of Example 2 at ×100 magnification. Transmission Field: approx 730×490 micrometres. Particles approximately 10 micrometres in diameter.

Figure 6:
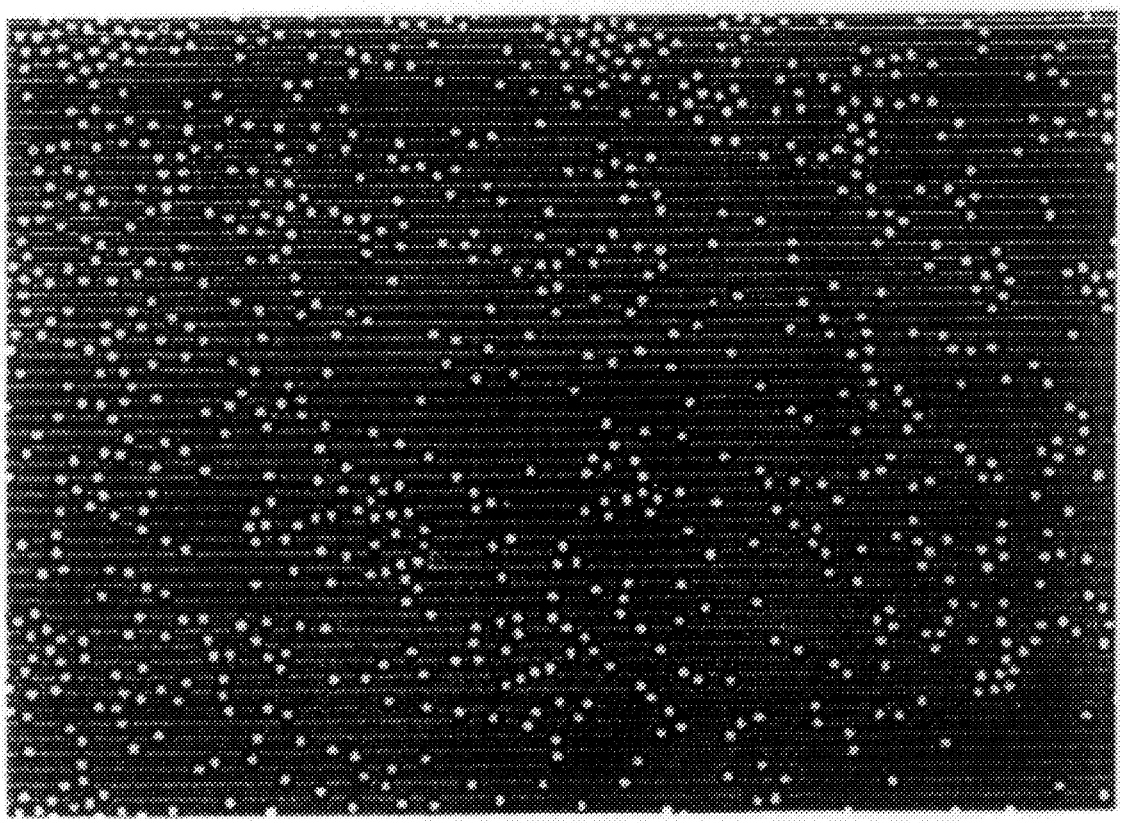

FIG. 6 is an optical photomicrograph similar to FIG. 5 of a coating prepared without the exposure to a magnetic field (comparative).

Figure 7:
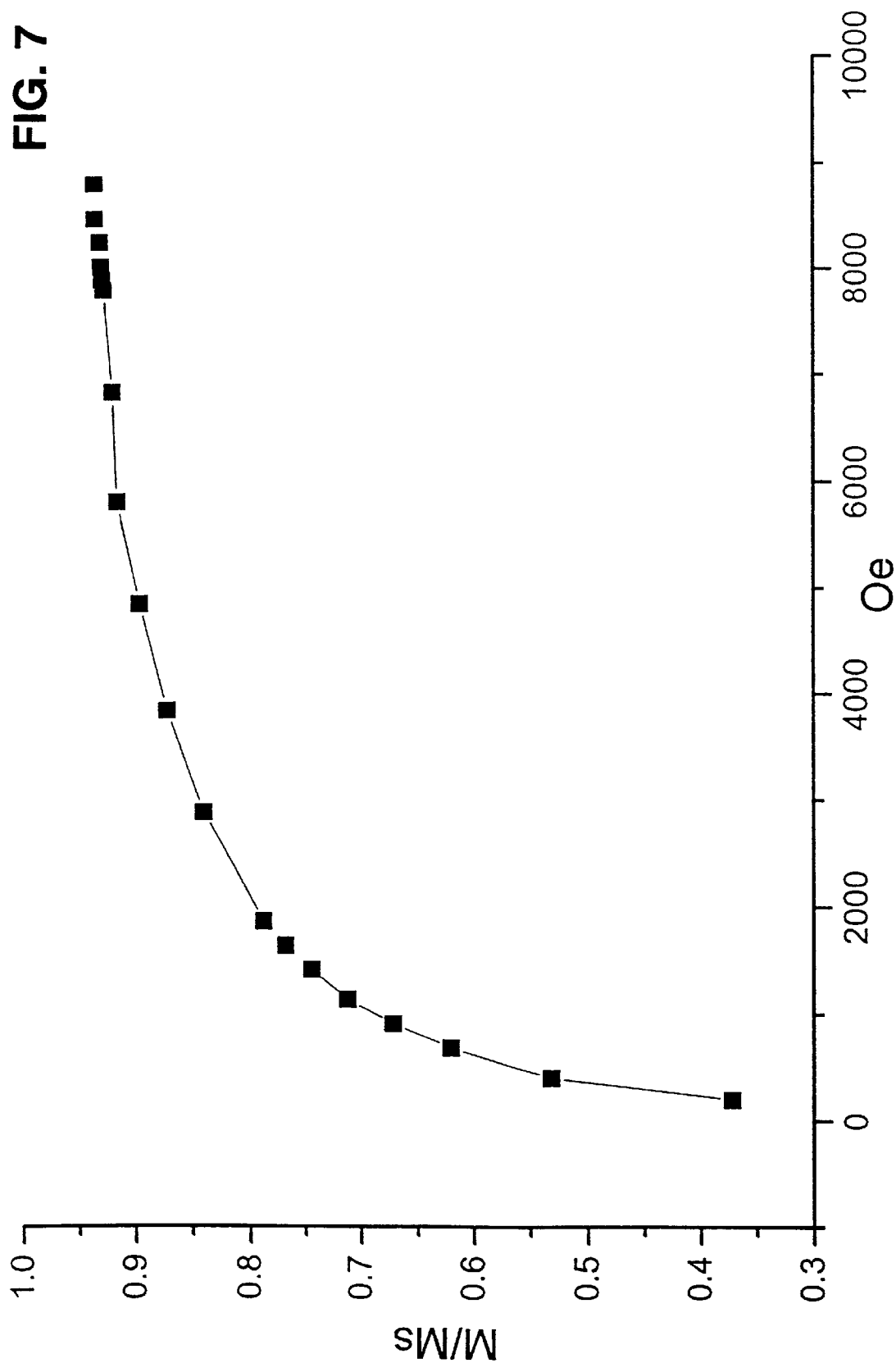

FIG. 7 is a magnetization curve as described in Example 3.

FIG. 8 is a viscosity-temperature profile as described in Example 3, viscosity being measured in centipoise (Nm$^-$$_2$s×$10^3$).

Figure 9A:
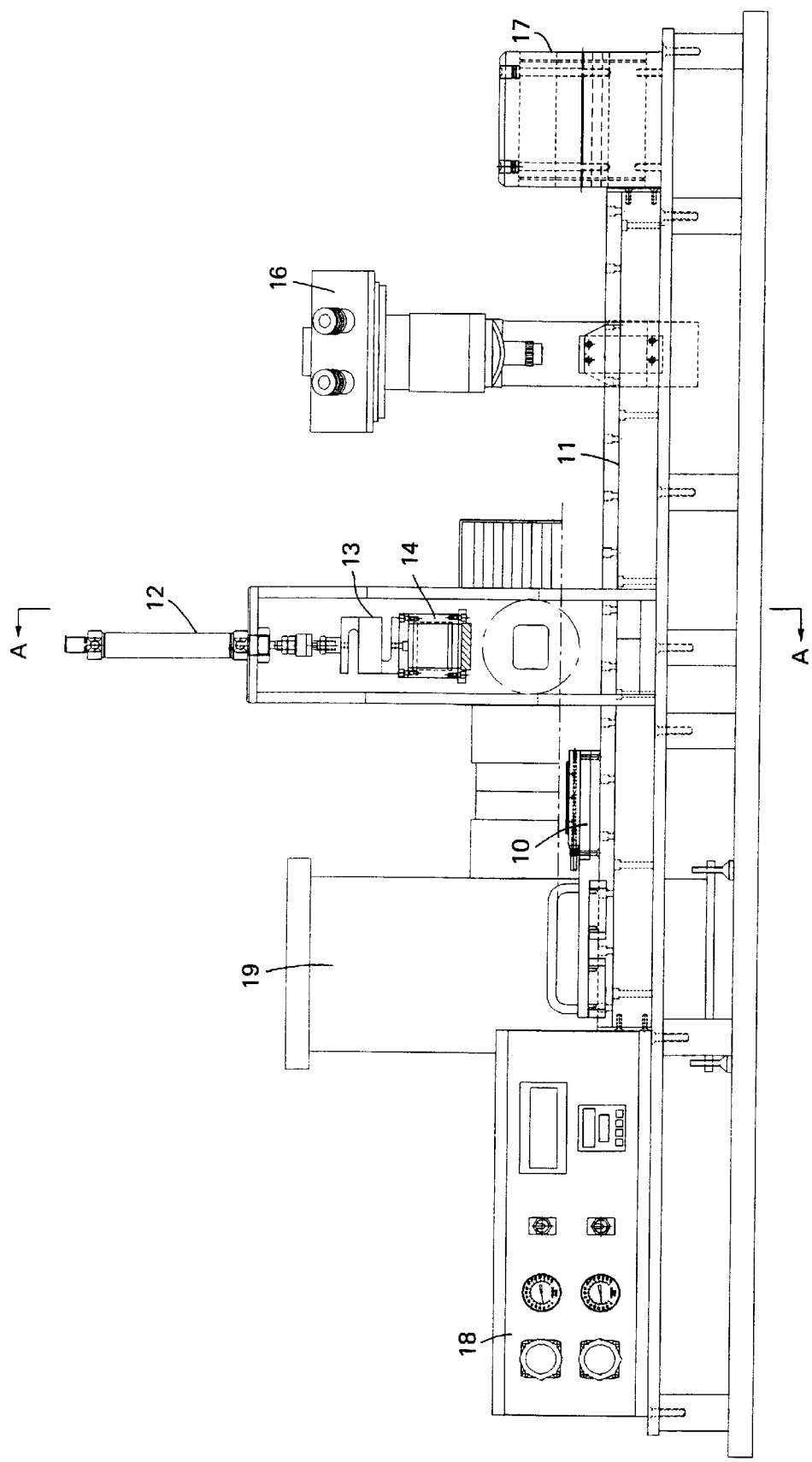

FIG. 9(a) is a diagram in side elevation of an apparatus designed and built to produce films having anisotropic conductive pathways.

Figure 9B:
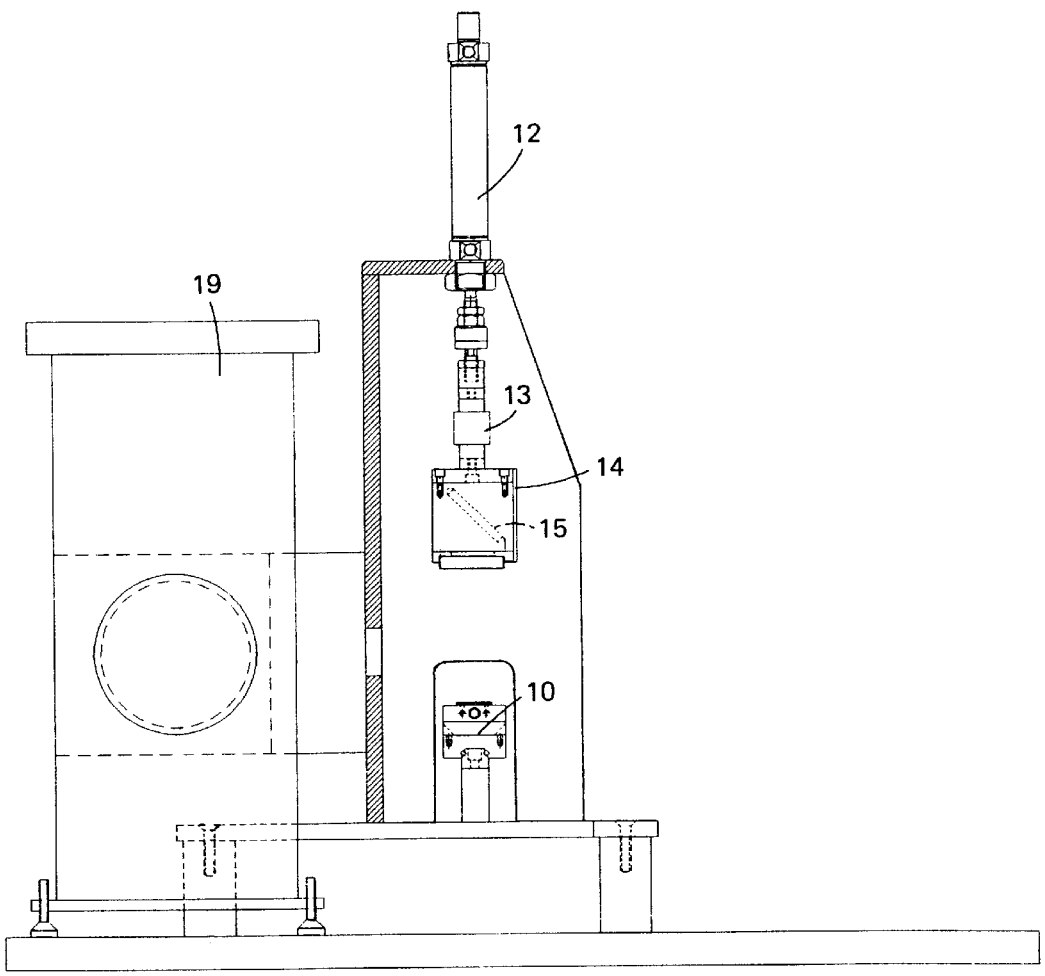

FIG. 9(b) is a diagram in elevation of the apparatus of FIG. 9(a), taken on the line A—A in FIG. 9(a).

Figure 10:
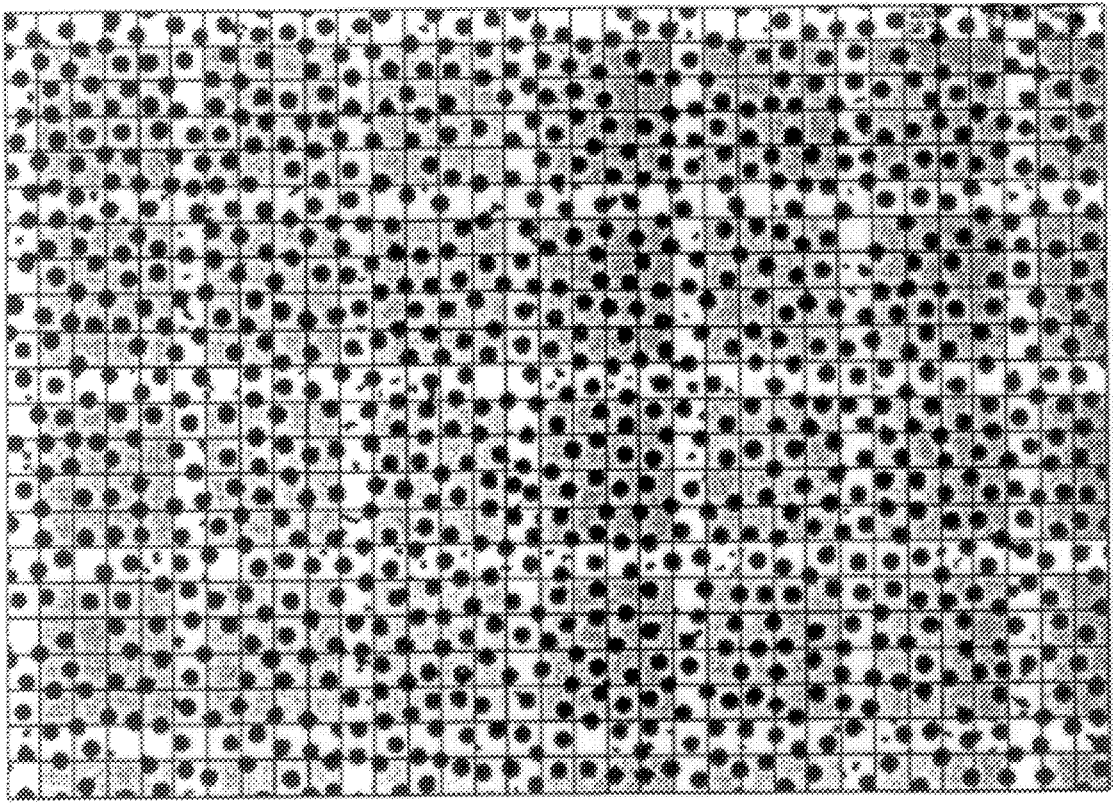

FIG. 10 shows an array of squares with 100 micrometre sides and separated by 25 micrometres superimposed on an optical photomicrograph of an A-staged free standing film containing 11.5 micrometre gold-coated polystyrene spheres (film prepared according to the method described in Example 5 using the formulation described in Example 7). The particles were ordered with a magnetic field prior to the photocuring step. In this Figure grey tones in the background have been reduced for clarity. The array of squares is computer-generated and is superimposed on the micrograph in the computer.

Figure 11:
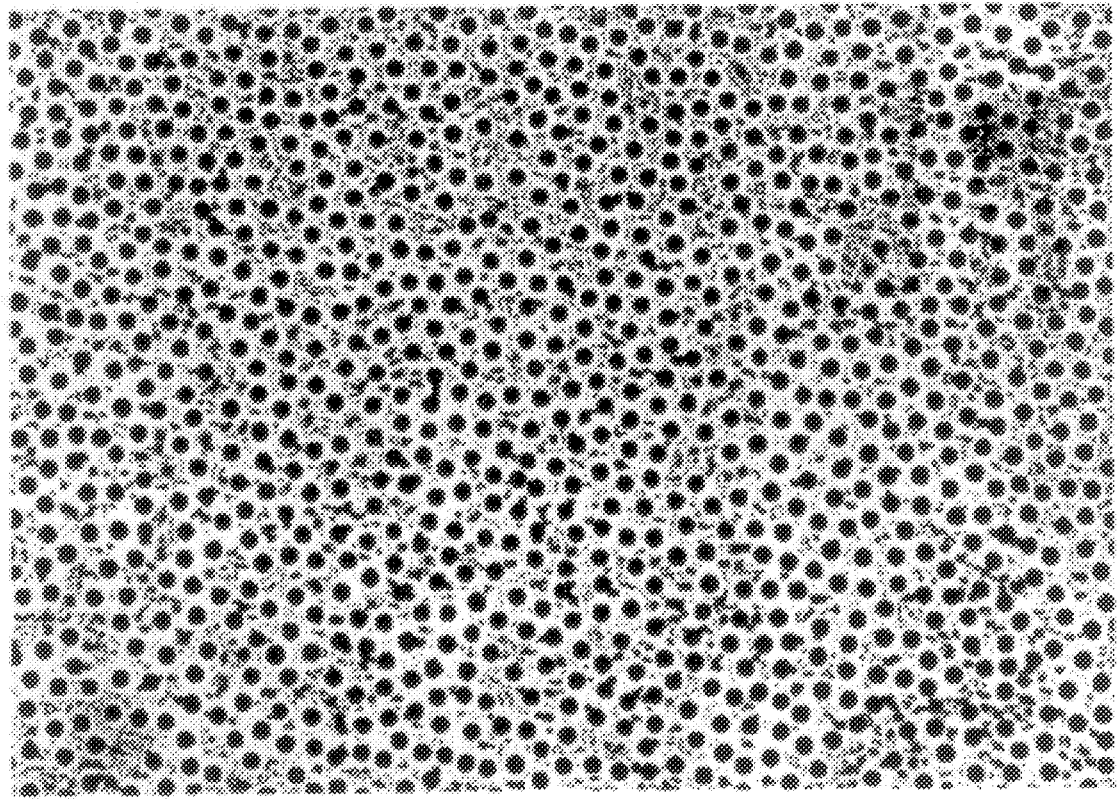

FIG. 11 is an optical photomicrograph depicting the same sample as decribed in FIG. 10 without the square array superimposed in the image. Grey tones have not been altered (cf FIG. 10).

DESCRIPTION OF THE PREFERRED EMBODIMENTS

EXAMPLE 1

Magnetite particles of average particle diameter 9.7 nanometres, (Liquids Research Limited, Unit 3, Mentech, Deiniol Road, Bangor, Gwynedd, U.K.) were coated with oleic acid and dispersed in heptane at an appropriate content (3.5% and 8.4%) by volume magnetite to produce fluids with magnetizable saturation of 100 G and 250 G as described below. Five millilitres of the above mentioned heptane-based material was added to 5 ml of butane diol dimethacrylate and a further 2 ml of a secondary surfactant was added which was an acid form of an aromatic phosphate ester sold under the Trade Mark GAFAC RE610 by GAF (Great Britain) Limited and now available as RHODAFAC RE610=GAFAC RE610 from Rhone Poulenc Chimie, France. This is described as nonoxynol-9-phosphate.

A good quality ferrofluid resulted with good stability. Fluids with magnetizable saturation of 100 G and 250 G were thus prepared. The saturation magnetization curve was steep and typical of superparamagnetic systems in that it exhibited no hysteresis. These fluids, even when formulated with radical initiators, were stable for periods of one year at room temperature when stored in air permeable polyethylene bottles such as those used for the storage of traditional anaerobic adhesives by those skilled in the art.

The butane diol dimethacrylate ferrofluids could be polymerized in the bulk with standard radical photo and/or thermal initiator systems.

To the butane diol dimethacrylate based ferrofluid of 100 G was added 10% weight/weight spherical gold-plated cross-linked polystyrene microparticles of 11 micrometre diameter and 6% w/w of photoinitiator 2,2-dimethoxy-2-phenyl acetophenone.

The said particles are essentially monodisperse (i.e. of substantially uniform shape and diameter) and are an article of commerce from Sekisui Fine Chemical Co Ltd, Osaka, Japan.

The particle loaded, photocurable ferrofluid adhesive composition was applied to a rigid, elongated substrate and a flexible or rigid release layer was placed on top to form a trilayer structure. When the upper layer was flexible, a further rigid substrate was placed on top to ensure flatness and that a uniform pressure was applied across the multi-layer structure.

Figure 1:
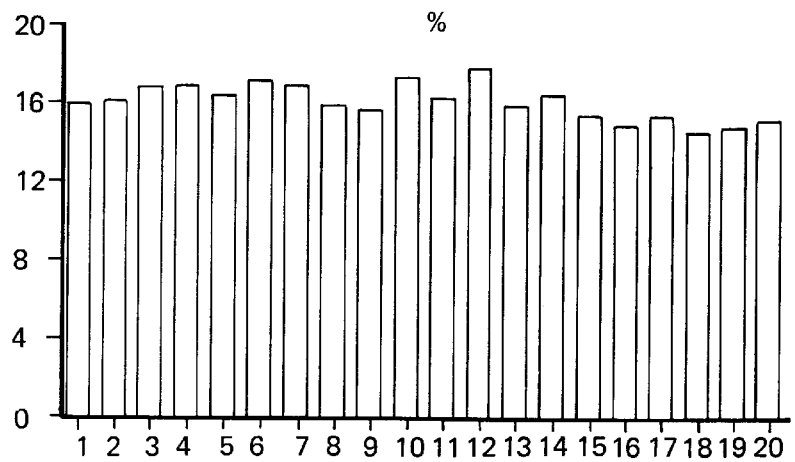
FIG. 1 is an image analysis (20 optical fields, 100× magnification) of photocured ferrofluid film containing gold-coated polystyrene spheres of 11 micrometre diameter (Example 1). The figure shows the field measure of area percent covered by particles, against field numbers.

The multilayer structure was placed in the centre of a Halbach magnetic cylinder (Magnetic Solutions Ltd, Dublin, Ireland). The cylinder had a central bore of 28 mm and was 63 mm in length and delivered a uniform magnetic field of 0.26 T which was applied normally to the substrate (multilayer). After approximately one minute the multilayer was withdrawn and photocured for approximately 90 seconds with an EFOS Ultracure 100 SS UV lamp. The release layer was cleanly separated to leave a supported, cured coating with uniformly aligned conductive particles locked in place. In this way film section with high quality particle ordering could easily be achieved over areas greater than square centimetres. The quality of the ordering was assessed with an Optical Image Analyzer (Buehler Omnimet 3 Image Analyzer Illinois, USA). FIG. 1 illustrates the area percent coverage over 20 optical fields, the standard deviation over 20 fields was 0.806%.

The results in FIG. 1 are summarized as follows:

|   |   |
|---|---|
| Minimum | 14.993% |
| Maximum | 18.038% |
| Mean | 16.354% |
| Standard Deviation | 0.806% |
| Field Area | 100728.594 micrometers$^2$ |
| Total Area | 2.015 e + 06 micrometers$^2$ |
| Field Count | 20 |

Figure 2:
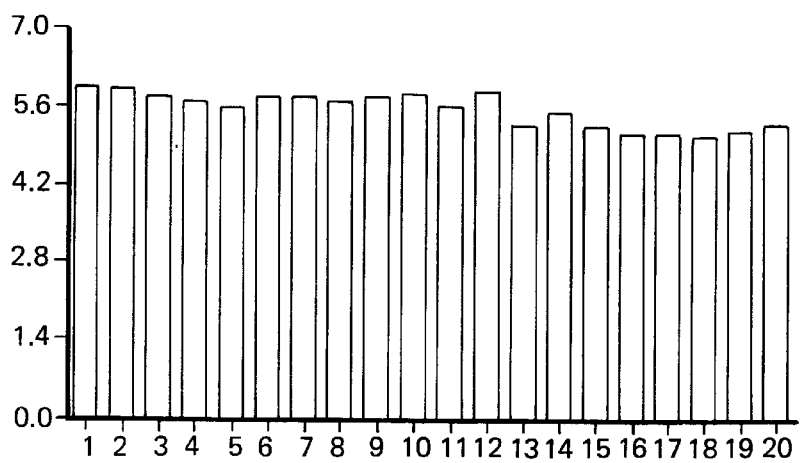
FIG. 2 is a corresponding image analysis of the film of FIG. 1 for the field measure of density of the particles in 1/$mm^2$ (×1,000), against field numbers.

FIG. 2 illustrates the density of particles distributed in the cured field over twenty randomly selected fields—the data indicate a mean of approximately 5668 particles per square millimeter.

The results in FIG. 2 are summarized as follows:

|   |   |   |
|---|---|---|
| Minimum | 5291.447 | 1/mm$^2$ |
| Maximum | 6006.239 | 1/mm$^2$ |
| Mean | 5667.706 | 1/mm$^2$ |
| Standard Deviation | 240.559 | 1/mm$^2$ |
| Field Area | 0.101 | 1/mm$^2$ |
| Total Area | 2.015 | mm$^2$ |
| Field Count | 20 | |

Figure 3:
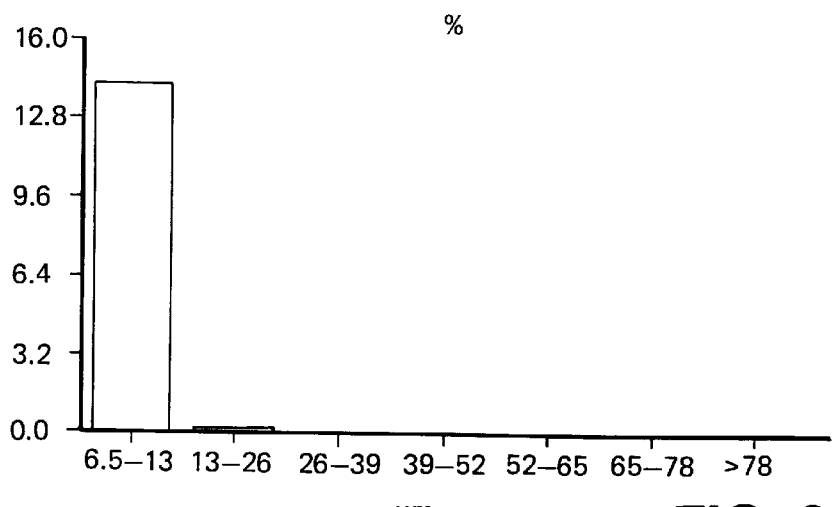
FIG. 3 is a corresponding image analysis of the film of FIG. 1 for characterization of aggregation of the particles by area measure of sample area (%) against size in micrometres.

A computer routine was written to identify the incidence of particle/particle interaction in the optical image so that any visual 'objects' of size substantially greater than the 11 micrometre diameter would be recorded and characterized as aggregates—the size of an aggregate being a multiple of this 11 micrometre diameter plus a small margin for geometric error. Thus the less than 13 micrometre size category can only capture single particle objects (nominally 11 micrometres), the 13–26 micrometre category can only capture dimers, or two particle aggregates (theoretically 22 micrometre maximum end to end length), and so forth for an optical field comprising a particle filled layer of monolayer thickness with respect to sphere diameter. FIG. 3 illustrates the data generated after examination of twenty randomly selected optical fields for the ordered, cured film.

|   |   |
|---|---|
| 6.5–13 micrometers | 14.281% |
| 13–26 micrometers | 0.067% |
| 26–39 micrometers | 0.015% |
| 39–52 micrometers | 0% |
| 52–65 micrometers | 0% |
| 65–78 micrometers | 0% |
| 778 micrometers | 0% |
| Total Area | 2.015 e + 06 micrometers$^2$ |
| Field Count | 20 |

It can be seen that 99.5% of the area analyzed was in the form of discrete single particles and the remaining 0.5% occurred in dimeric form only. The twenty optical fields analyzed were typical of the larger ordered regions of the macroscopic sample. Twenty fields at 100× magnification corresponded to a total area of approximately 2 square milimetres and hence an average of 11336 particles from FIG. 2. Thus approximately 56 particles (0.5%) were not discrete or single particles in this experiment but were actually in dimeric form, that is, only 28 particles were paired in the entire area. Pairing of particles to this extent was probably due to inadequate wetting of these specific particles.

EXAMPLE 2

Figure 4A:
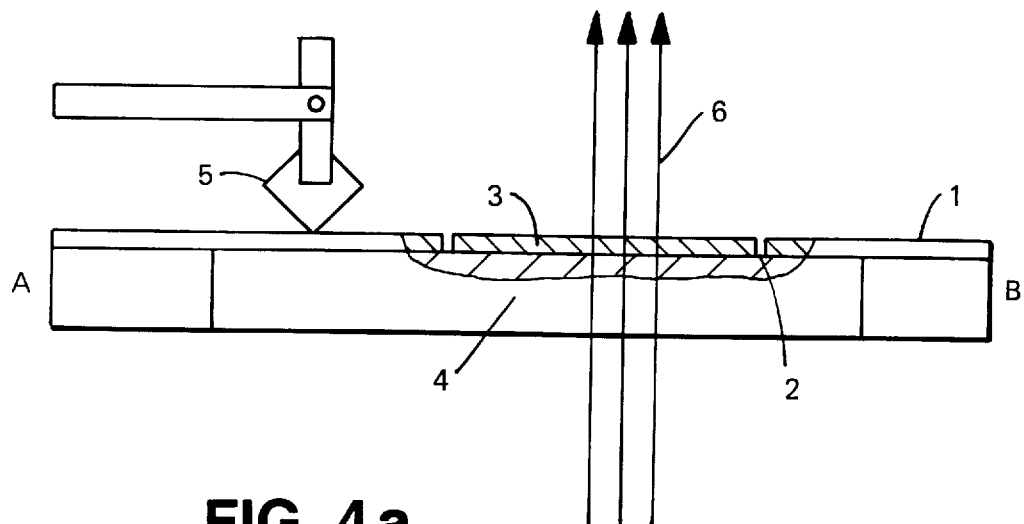
FIG. 4(a) is a diagram (side view) of apparatus for carrying out the coating method of Example 2.
Figure 4B:
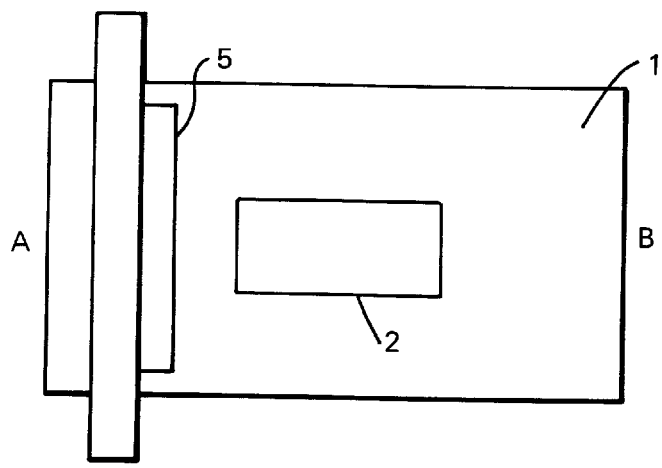
FIG. 4(b) is a top view diagram of the apparatus of FIG. 4(a).

(a) In order to demonstrate the in situ ordering of magnetic holes in a ferrofluid coating, the following experiment was conducted. A DEK 245high performance multipurpose screen printer was modified in such a way that a substantially uniform magnetic field could be applied to a specific area of an overlying substrate, such that the direction of the magnetic field was orthogonal to the substrate and the so-called 'worktable' of the printer (DEK Printing Machines LTD, Dorset, England). As shown in FIG. 4 the conventional worktable of the DEK 245 was replaced with a custom-built worktable which comprised a polished aluminium surface plate (320 mm×240 mm) (1) with a central milled depression (2) sufficient to accommodate a standard glass microscope slide (approximately 76 mm×25 mm) (3).

The polished plate was mounted over an array of flat permanent magnets arranged so that a stripe of magnetic material (4) some 170 mm long by 50 mm wide lay directly beneath the milled depression in the plate, the said depression being located approximately 70 mm from the squeegee (5) end of the stripe so that a magnetic field was developed in advance of the substrate (slide 3) with respect to the direction of print, the direction of print being that which moves squeegee blade (5) from left of FIG. 4 (A end) to the right of the Figure (B end). The magnetic stripe was constructed from a series of flat ferrite magnets each 40 mm×25 mm×8 mm (length×width×depth). These were poled across their thickness and collectively delivered approximately 400 Oe field strength, measured directly on the surface of the overlying polished plate. Each magnet had its flat face parallel to the face of polished worktable top plate (1) and was arranged so that the long dimension of each magnet was parallel to the long axis of the top plate. Flanking the central magnetic stripe on either side, were two similar stripes poled in the opposite direction to the central stripe. All three stripes were bonded together to complete a magnetic circuit with vertical flux lines (6) rising up through the substrate coincident with the milled depression (2) in the top plate (1).

In comparative experiments where no magnetic field was required, the same polished top plate was used, but the array of underlying magnets was temporarily removed.

A particle-filled ferrofluid formulation was prepared based on a commercially available ferrofluid having a 1500 cps (1.5 $Nm^{-2}s$) viscosity (APG 057 available from Ferrofluids, Inc, NH, USA) and 10 weight percent of transparent 11 micrometre cross-linked polystyrene spheres (Sekisui Fine Chemical Co., Osaka, Japan). The spheres were thoroughly dispersed in the formulation by vigorous mixing. The formulation was applied to the magnetic worktable (1) in a 20 mm stripe positioned about 20 mm in advance of the milled depression (2) which now contained a standard laboratory microscope slide (3). The worktable was raised to a position that would enable the printing of a thin coating of ferrofluid. The worktable position, printing speed, printing pressure, and squeegee type were adjusted in independent experiments to optimize coating for the particular formulation under consideration. The motorized squeegee blade pulled the formulation across the length of the microscope slide. During this coating action the filled fluid experienced a magnetic field. After the printing cycle the squeegee blade lifted free from the worktable surface and reverted to its original position in readiness for another operation.

The coated substrate (3) was examined optically using a microscope connected to an optical image analyzer. The latter equipment is capable of processing the image and assessing the quality of the field-induced ordering of particles in the ferrofluid. The particles order in the ferrofluid coating because they act as magnetic holes in the fluid matrix. The phenomenon of magnetic holes has been described by Skjeltorp (see for example "One and Two Dimensional Crystallization of Magnetic Holes" in Physical Review Letter, 51(25), 2306, 1983) in fluid films which are confined in a cavity formed by two rigid substrates. In this case, the coating was unconfined.

Image analysis of the coated substrate indicated that a substantially uniform film with discrete particles dispersed therein resulted as illustrated in FIG. 5.

A comparative experiment was conducted using the above mentioned formulation and methodology except that the array of magnets was removed from the underside of the worktable. The results of this experiment are indicated in FIG. 6 and clearly show that the particles are not uniformly dispersed nor isolated as discrete particle entities.

Although this Example was carried out using a non-curable ferrofluid composition and non-conductive particles, the Example illustrates the method which can be used in drawing down a coating in accordance with the invention, as described elsewhere herein.

(b) In order to demonstrate the effect with polymer-based systems, epoxy-novolac ferrofluid solutions were developed. These essentially comprised resinous materials dissolved in volatile ferrofluids derived from methyl ethyl ketone (MEK) and toluene. Ferrofluid solvents having saturizable magnetisation ($M_s$) values of 112 and 166 G in MEK and toluene respectively were prepared. These were used to dissolve epoxy-novolac DEN 438 EK85 (Dow Deutschland, Werk Rheinmuenster) and bisphenol F epoxy monomers at an overall concentration of 20 w/w. The relative percentage weight of each constituent and curatives are listed below. The concentration, $M_s$, and viscosity of these solutions could be adjusted by solvent evaporation.

| | |
|---|---|
| Epoxy Bisphenol F Dow, US | 78% |
| DEN 438 EK85 (in ferrofluid solvent) | 13.9% |
| DICY (Dicyandiamide) | 7.0% |
| BDMA (benzyl dimethylamine) | 1.0% |

Conductive particles of 25 micrometre diameter were loaded at 10% w/w into the abovementioned casting solutions and drawn down onto conductive substrates such as copper or gold clad FR4 boards. The boards were taped in place on an ACCU-LAB™ draw down coater (Industry-Tech., Oldsmar, Fla.) and the formulation was drawn down with Meyer rod to give a wet thickness of approximately 40 micrometres. The coated substrate was placed into a Halbach magnetic cylinder with the uniform field of 0.6 Tesla disposed normally to the sample plane. Poling was conducted when the film was still wet and solvent evaporation proceeded while the sample remained in the magnetic field until a tacky film was obtained. This was examined under the optical microscope and particle ordering was confirmed. The film was subsequently dried by warming at 80° C. for several hours (A-stage drying). Copper substrates were placed onto the dry films and were bonded by heating under pressure at 180° C. for approximately 30 minutes (B-stage). Whereas the above-mentioned formulations form a film that was too brittle to remove from the substrate even when release-coated, the Example nonetheless illustrates the method of locking particles in a polymeric matrix which is solidifiable by solvent evaporation (A-stage) and cross-linkable subsequently (B-stage).

EXAMPLE 3

An epoxy based formulation was prepared based on the following composition:

| CONPONENT | COMMERCIAL NAME/ SUPPLIER | WEIGHT % |
|---|---|---|
| Triglycidyl Aliphatic Ether Resin | HELOXY 5048 (Shell Chemicals) | 38% |
| Cycloaliphatic Epoxy Resin | CYRACURE UVR6351 (Union Carbide) | 10% |
| Bisphenol A Diglycidyl Ether Polymer | ARALDITE 6010 (Ciba) | 50% |
| Thermal and/or Photoinitiator 1 | IRGACURE 261 (Ciba) | 2% * |
| Photoinitiator 2 | GE1014 (General Electric) | 2% * |

* In both cases the initiators were as 50% solutions in propylene carbonate. Therefore 2% above refers to 1% actual initiator (i.e. a 50% solution).

A liquid film of said composition photocured in an 'A' stage (primary cure) after 2×60 second exposures (one per side), yielded a supple solid film. This film could be transferred to a metal lapshear and an adhesive bond formed by overlapping with a further metal lapshear. When this 'sandwich' structure was clamped and heated to approximately 115° C. for 30 minutes, the metal lapshear specimens were strongly bonded (secondary cure).

The composition described above was rendered into a ferrofluid by the addition of precoated magnetite using techniques known to those skilled in the ferrofluid art and alluded to in Example 1 of the application and also in the parent application. The magnetization curve for the epoxy ferrofluid is shown in FIG. 7. The magnetization saturation for this fluid was 97 gauss. The viscosity-temperature profile for this fluid (designated) LOC 22 is illustrated in FIG. 8.

The viscosity of the Ferrofluid was further modified by dilution with 10% of the CYRACURE UVR6351 cycloaliphatic epoxy resin. A thin liquid film of this composition could be photocured to form a supple film as noted previously. However the ferrofluidized version had increased exposure times (2.5 minutes per side), even with increased levels of the photoinitiators.

To the liquid epoxy ferrofluid composition was added 15% (w/w) 11.5 micrometre gold-coated polymer monospheres available from SEKISUI KK, Osaka, Japan.

Using this conductive particle loaded composition, a thin liquid film was prepared on two conductive substrates i.e. ITO coated glass and copper foil. In both cases, a transparent polyester film was placed on top of the liquid film. A further rigid substrate was placed on top of the polyester and pressure was applied by hand to squeeze the liquid film into position prior to poling in a uniform magnetic field of 0.6 Tesla in strength (applied normally to the substrate plane). Poling was conducted for a period of 1 to 5 minutes. Magnetic aligning times could be reduced by gently heating the sample prior to ordering. There is a pronounced drop in viscosity in the ferrofluid composition as a function of temperature. (FIG. 8).

Following magnetic ordering (poling), films were subsequently UV irradiated to induce an A-stage (primary) cure. After photocure the backing polyester film was removed to expose the conductive particle-loaded primary-cured epoxy solid coating on a conductive substrate. A further conductive substrate was then clamped onto the aligned conductive coating and measurements of contact resistance were recorded in the Z axis using the four point probe method and a GEN-RAD 1689 PRECISION DIGIBRIDGE. Contact resistances ranging from 40 to 100 milliohms were recorded for copper bonded to ITO (indium tin oxide).

The primary cured film, sandwiched between conductive substrates was subsequently subjected to a B-stage (secondary) heat cure (110° C. for 30 minutes). The substrates were strongly bonded and Z axis contact resistance data was typically 50 milliohms for copper bonded to ITO (indium tin oxide).

EXAMPLE 4

As already described, adhesives derived from coatings or films can be made by B-staging a pre-cast material. In such cases, the primary solidification, or A-stage, may result from solvent evaporation and/or partially induced thermal cure. The A-stage, which has the function of locking conductor particle arrays in place, may equally be performed by chemical reactions which cause partial gelling at temperatures which are nevertheless well below the thermal threshold temperature required to trigger latent polymerisation catalysts used to activate subsequent B-stages, e.g. <120° C. in the case of dicyandiamide (DICY). An example of a system that operates at room temperature involves reaction between multi-functional isocyanates and polyols to yield a polyurethane. The ferrofluid content of such a formulation may be derived from a ferrofluid polyol, a ferrofluid isocyanate or from some other monomeric system which does not enter into polyurethane formation but is present to provide subsequent heat cure, eg, ferrofluid epoxy or acrylic monomers. The formulation below has been used to order conductive particles and lock them in place by chemical reactions (polyurethane formation) at room temperature which were unassisted by light:

| | |
|---|---|
| Hexamethylene Disocyanate | 1.1 g |
| Hydroxy Ethyl Methacrylate (HEMA) | 0.7 g |
| Ferrofluid - Butane Diol Diglycidyl Ether ($M_S$ = 343 G) | 1.47 g |
| DICY | 0.07 g |
| Benzyl Dimethylamine | 0.015 g |
| 25 micrometer Au coated polystyrene spheres | 0.1 g |

Systems derived from ferrofluid versions of HEMA ($M_S$= 115 G; viscosity at 27° C.=5.5 cPs—0.0055 $Nm^{-2}s$) were also prepared. The HEMA based ferrofluid is however unstable.

An alternative approach to locking particles in ordered arrays in ferrofluid adhesives involves photochemistry. Thus the A-stage can be a photoinduced cationic or radical cure. Formulations which respond in this way may only partially cure with light, or may comprise two different types of reacting system which act independently (in the same or in different monomers). In the former cases a mixed cycloaliphatic and non-cycloaliphatic system may be partially cured with photocationic initiators and subsequently thermally cured in a B-stage process. In the latter case, a mixed acrylic-epoxy system may be designed and a photoinduced radical cure used to act on the acrylic functionalities to lock ordered conductor arrays in place. Examples which follow describe these approaches in detail.

EXAMPLE 5

In order to produce high quality anisotropically conductive adhesives or films (ACAs or ACFs respectively) it was necessary to design specialised formulations and specialised equipment. The film making equipment is illustrated in FIG. 9 and provides films up to approximately 20 square centimeters in area, although the test pieces routinely used were approximately 7.5 square centimeters in area. This example describes in detail the apparatus used to produce films and the processing steps involved.

As shown in FIG. 9, carriage 10 which is a flat platform constructed from polished non magnetic steel is used to hold the sample. The carriage comprises a vacuum chuck to hold a substrate in place as well as a cartridge heater capable of raising the platform temperature to approximately 100° C., and a thermocouple for temperature sensing. The carriage is mounted on a Tufnal base to prevent any thermal transfer to the substructure on which it rests. The carriage rides on single track 11, again constructed from non magnetic material. The arrangement is such that the mounted carriage assembly can be moved to specific positions from the leftmost side of the apparatus to the right. On so doing it can be passed into the central plane of large magnetic (Halbach) cylinder 17. When processing is finished, the carriage can be retracted and moved from the right of the apparatus to the left.

The ferrofluid adhesive formulation containing a plurality of conductors is applied to a release coated substrate mounted on top of carriage 10. The said substrate is flat and may be reflective. A similarly treated substrate is placed over the top of the ferrofluid adhesive film. This substrate is UV transmissive When the ferrofluid adhesive composition comprising a plurality of conductors is confined by the two substrates the disposition of the conductive particles is initially random in three dimensions. The confined fluid is brought and locked into position in the next step of the film making process. If initial film assembly is considered step 1 of the process, the second step may be described as 'wet film thickness determination'. In this second step, the assembled film is compressed by apparatus identified by numerals 12–14 in FIG. 9. The object of this compression stage is to produce a homogeneous fluid film occupying the entire area of the confining top substrate with excessive liquid being squeezed out around the entire periphery of the top substrate. Not only does the compression achieve a substantially uniform fluid film, but pressure is applied which produces a fluid layer between the substrates such that the liquid layer is less than two conductive particle diameters in thickness. This situation is referred to as a monolayer of conductive particles. The fluid film is however thicker than a particle diameter so that the individual particles are free to move in the XY plane of the sample.

The hardware used in this second stage comprises an air driven cylinder 12 capable of delivering a continuously variable pressure up to 20 Kgs per square centimeter, a pressure measuring device 13 and a specially designed cube 14 which eventually applies pressure to the film assembly. Cube 14 is open on one of its vertical faces to allow optical access for a UV beam. At a position corresponding approximately to the cube diagonal a high quality mirror 15, tuned to optimise UV reflection, is mounted at an angle of 45 degrees or less to deflect light downwards towards the underlying sample. The bottom face of the cube, ie, that which is parallel to the sample plane, is a high quality fused silica optical flat 1 centimeter in thickness and approximately 5 centimeters on each side. This component is flat to $\lambda/4$ or better over 25 square millimeters measured at the green Ar ion laser line. The optical window in the cube base created by this component after mounting onto the cube assembly is 3 centimeters×3 centimeters. The optical flat sits proud from the base of the cube framework and hence applies pressure across an area up to 5 centimeters×5 centimeters. The entire assembly attached to the cylinder 12 can be made appear weightless by differential pressure control to the cylinder regulated through precision controls in box 18. These controls also enable extremely gentle touch down of the assembly onto the sample below. Control box 18 further comprises heater control and feedback for the carriage cartridge heater. The remaining sides of the cube framework are polished metal optionally fitted with heat sinks on their outer surfaces. A heat sink may also be bonded to the rear side of the mirror within the cube to remove any heat generated by the lamp.

To generate a wet film having a thickness of approximately one conductive particle diameter, the pressure controls are regulated to compress the film assembly. This requires pressures typically in the order of a few Kgs per square centimeter. The pressure is then removed and the film remains essentially at the compressed thickness. The carriage 10 bearing the compressed film is then inspected in step 3. Inspection is conducted with reflective mode microscope 16 usually operating at 200× magnification. The length of the film can be scanned. The image is relayed to a monitor by a video camera attached to the trinocular head of the microscope. When the operator is satisfied that the film is a monolayer with respect to thickness, the assembly can be sent to the next process step. If the film is not a monolayer, it may be sent back a step and recompressed under different conditions until a satisfactory result is observed. Once in monolayer configuration, the film is advanced into the poling gate 17 which comprises a large Halbach magnetic cylinder with a circular aperture of approximately 55 millimeters and a length of approximately 140 millimeters. This permanent magnet has been designed and constructed to deliver a substantially uniform magnetic field over the vast majority of its length. The Halbach cylinder delivers a field of 0.6 T, the orientation of which may be controlled by rotating it in its cup shaped housing. The strength of the magnetic field was selected to substantially saturate the ferrofluid compositions employed. To achieve a uniform dispersion of conductive particles such as that depicted in FIG. 5, the field will be applied normal to the sample. It has however been found helpful to achieve very high degrees of order to first pole the sample with the field direction parallel to the sample then subsequently redirect the field to a position normal to the sample. The period required for poling depends on a number of parameters such as the composition of the fluid with regard to magnetisable material, magnetisation saturation of the fluid at the specific field applied, the viscosity of the formulation, the temperature of the sample, etc. The sample temperature can be regulated by heating the mounting platform 10.

After the fourth step of poling, the sample is retracted from the magnet and reinspected to check for conductor particle ordering. If ordering is not satisfactory, the sample may be re-poled. At this fifth stage or at the third inspection stage, the video camera output may be connected to an optical image analyser which provides quality control of the ordering process. The ordered fluid film is next retracted in step six back to the compression position. The ordered sample may be photocured at this point with or without pressure applied to the liquid film. In this process the sample is illuminated with UV light, item 19 in FIG. 9, to induce photocure and lock the arrayed conductors in place. An Oriel 1 kW XeHg arc lamp (LOT ORIEL, Leatherhead, Surrey, UK) with a 50 millimeter beam diameter and fitted with a dichroic mirror and electronic shutter was built into the film making fixture and used to partially cure, or A-stage, the ACFs. Following UV irradiation, the pressure, if applied, was released from the assembly and the cured film was carefully released from the substrates. The central section of the thus produced ACF, which was approximately 7.5 square centimeters in area, was used for physical testing.

Following cleaning or replacement of substrates, the operation could be repeated. The apparatus was designed to accommodate different types and sizes of conductor particles and different viscosity formulations. Process parameters could thus be obtained for continuous film making equipment.

EXAMPLE 6

A typical formulation designed for the abovementioned processing equipment is described in the current example. Formulations must be designed, thus:

a) to produce an A-staged film, i.e., a solidifable form which may be handled in a supported or unsupported form. The A-staged film may be used in a thermoplastic system.

b) to produce a further cure stage or B-stage, if a thermoset is required, which is activated by the end user to cause adhesion between substrates to be bonded together.

c) to be capable of ordering "magnetic holes" in its fluid state, for example through the use of magnetisable fluids; this requires careful consideration of fluid viscosity and/or its relationship with temperature or shear forces for example.

d) to comprise conductors of regular geometry which provide conductive pathways between the conductive pads on one substrate and the conductive tracks or pads on another.

For the purposes of this example and the apparatus detailed in Example 5, the A-stage is effected by photocure.

However the use of heat, E-beam cure, solvent evaporation, cooling, in particular from a melt, chemical reaction, physical association phenomena, etc., are also valid means of effecting viscosity increases to an effectively solid A-staged condition which is used to lock arrays in place following ordering in an initial fluid state.

When photocure is used, it may be preferable to design a formulation such that the photocure mechanism is specific to certain formulation components and ineffective towards others. Thus, for example, an epoxy acrylate combination may be photocured by photolysis of a radical photoinitiator, such as benzophenone. In this case the acrylate functions are susceptible to cure whereas the epoxy functions are not. This scheme is preferable to a hybrid all epoxy formulation comprising a mixture of cycloaliphatic epoxies and bisphenol A type epoxies for example (cf. Example 3). In the latter case, cycloaliphatic epoxies are more susceptible to cationically induced photocure than the bisphenol A type epoxies, so that an A-stage can be effected. However, because the hybrid formulation comprises epoxies only, no clear distinction can be made and a proportion of bisphenol A epoxies, destined to subsequently cure in a B-stage, may undesirably cure during the A-stage. If this happens the ultimate strengths achievable after B-staging may be adversely affected.

In order to achieve extremely high degrees of ordering of conductors in the ferrofluid version of the adhesive formulations, it is preferable that the viscosity be less than 1500 cPs (1.5 $Nm^{-2}s$) and most preferably less than a few hundred cPs or less at the poling operation temperature. It may also be preferable to ensure that the initial formulation is all liquid in nature before addition of conductive particles. For example liquid anhydride hardeners may be used to effect epoxy cure in the B-stage as alternatives to DICY. The preference for all liquid systems relates to the fact that any included particle in a ferrofluid formulation behaves as a "magnetic hole" once stimulated by a magnetic field.

Thus conventional heterogeneous hardeners for epoxies such as dicyandiamide (DICY) if used would behave like "magnetic holes". While this is not a problem per se, and may even be thought of as advantageous with regard to the distribution of curatives throughout the adhesive, particles of this sort may interweave with the conductor array and hence produce less than a substantially highly-ordered array of conductive particles. This however becomes less of a problem if the DICY is of small particle size, particularly if it is smaller in size than the conductive particles. A disadvantage of anhydride cured epoxies is cure speed. However it is known to those skilled in the art, that catalysts accelerate anhydride cure substantially. Suitable catalysts may be liquids such as benzyl dimethylamine (BDMA) or semi solids such as the HX epoxy hardener pastes from Asahi Chemical Industry Co. Ltd. An example of a catalysed formulation suitable for ACFs is described below:

| Component | Supplier | Description | Percentage w/w |
|---|---|---|---|
| Ebecryl Resin 604 | ucb Chemicals Drogenbos, Belgium | Acrylated epoxy. | 16.8 |
| Dihydrodicyclo Pentadienyl Oxyethyl Methacrylate | Rohm & Haas, Germany | Acrylate | 23.6 |
| Butane diol diglycidyl ether (BDDGE) | Aldrich, US | Epoxy | 15.8 |
| Bisphenol F | Dow, US | Epoxy | 15.8 |
| Nadic Anhydride | Aldrich, US | Latent hardener | 21.5 |
| Irgacure 1700 | Ciba-Geigy, UK | Photoinitiator | 3.0 |
| HX3722 | Ashai, Japan | Catalyst | 3.9 |

Such a formulation photocures after 20 seconds irradiation by a medium pressure UV arc lamp at a film thickness of approximately 25 micrometres. A Si die of 36 $mm^2$ was placed on top of the photocured (A-staged) film and bonded to a FR4 board with 100N force and 90 seconds heat treatment at approximately 180° C. Average die shear forces of around 450N were recorded for this size of die.

A version of the above formulation was built up by mixing ferrofluid adhesive monomers with standard monomers as outlined below:

| Reference Number | Component | Percent w/w |
|---|---|---|
| 1 | FF* - Ebecryl Resin 604 | 7.3 |
| 2 | FF - Dihydrodicyclo Pentadienyl Oxyethyl Methacrylate | 3.0 |
| 3 | FF - Bisphenol F | 14.8 |
| 4 | Butane diol diglycidyl ether (BDDGE) | 15.0 |
| 5 | Ebecryl Resin 604 | 9.5 |
| 6 | Dihydrodicyclo Pentadienyl Oxyethyl Methacrylate | 19.5 |
| 7 | Nadic Anhydride | 24.5 |
| 8 | Irgacure 1700 | 3.0 |
| 9 | HX3722 | 3.5 |

FF* refers to ferrofluid monomers prepared by Liquids Research Limited - see Example 1.

This can be performed either by adding two monomers to a third which has already been converted to a ferrofluid, or using a blend of monomers as a single polymerizable carrier. In the former case, the production of a typical ferrofluid based upon the low viscosity monomer Dihydrodicyclo Pentadienyl Oxyethyl Methacrylate (Ref 2 above) is detailed below:

Heptane intermediate:

Dissolve 404 g of Ferric Nitrate in pure water and make up to 500 mls. Dissolve 150 g of Ferrous Sulphate Heptahydrate in water and make up to 500 mls. Mix the above solutions together and add 450 mls of ammonia solution (specific gravity 0.88). Add 150 mls of oleic acid. Acidify the solution and separate the solid magnetite. Wash solids copiously with water and redisperse in heptane.

Production of Dihydrodicyclo Pentadienyl Oxyethyl Methacrylate ferrofluid using heptane stock:

Precipitate the required amount of heptane fluid and separate the solids. Add 0.3 ml/100 emu* of a phosphate ester surfactant such as GAFAC RE610 and 0.3 ml/100 emu of dispersant Bykanol-N from Byk-chemie GmbH, D-4230 Wesel, Germany. Add the required amount of monomer and heat to evaporate the residual solvent. *emu is "electro magnetic unit" which is an alternative unit for the expression of magnetic saturisation. 4×Pix ferrofluid density converts emu/g to Gauss units.

The approximate component percentages resulting from the above procedure are:

Dihydrodicyclo Pentadienyl Oxyethyl Methacrylate=80%
Oleic acid=5%
Magnetite=5%
Bykanol-N=<5%
Phosphate ester=5%

The above composition produces a ferrofluid of Dihydrodicyclo Pentadienyl Oxyethyl Methacrylate with a magnetisation saturation of approximately 100 Gauss. Stronger fluids require additional loading of magnetite. The ultimate strength of the fully formulated adhesive composition is determined by dilution of high strength monomeric ferrofluids which are relatively easy to prepare, with more viscous non-ferrofluid monomers. The three constituents of the abovementioned formulation, reference numbers 1–3, were derived from a single ferrofluid made up from these components in the appropriate ratios. A colloidally stable blend resulted with a viscosity at 27° C. of 1800 cPs (1.8 $Nm^{-2}s$) and an $M_S$ of 135 Gauss.

The ferrofluid adhesive formulation set out in the abovementioned table was cured and mechanically tested in the same way as the non-ferrofluid version of the formulation. Average die shear strengths of approximately 260N were recorded. Additionally when the formulation was loaded with 10% w/w 25 micrometre Au-coated polystyrene spheres and aligned in a magnetic field, then A- and B-staged according to the invention, Z-axis contact resistance measurements using the four point probe method recorded 10 mOhms with an upper Cu substrate and a Au-coated FR4 lower substrate.

To minimise migration or exudation of a surfactant in the ferrofluid adhesive composition, it may be advantageous to utilise a reactive or polymeric surfactant such as available from Monomer-Polymer and Dajac Laboratories Inc. Trevose, Pa. 19047, U.S.A. (see also Wu, H. F. et al., Polymer Composites, 12(4), 281, 199; Rao, A. V. et al., Paint and Ink International, 15,1995; Holmberg, K, Surface Coatings International (12), 481, 1993).

EXAMPLE 7

In the present example, photochemistry is also used to invoke A-stage cure, however the constituents of the formulation which are responsive to photocure are derived from acrylic monomers rather than epoxies. The basic formulation is detailed below:

| Reference Number | Component | Percent w/w |
|---|---|---|
| 1 | Epoxy-Acrylate resin IRR282, ucb Chemicals, Drogenbos, Belgium | 36.71 |
| 2 | Bisphenol F, Dow, US | 10.84 |
| 3 | Irgacure 1700, Ciba-Geigy, UK | 3.85 |
| 4 | Butane diol diacrylate | 26.92 |
| 5 | DICY | 5.24 |
| 6 | Benzyl dimethylamine | 0.35 |
| 7 | Au-coated spheres, Sekisui KK, Osaka, Japan | 16.08 |

In order to optimise viscosity and magnetic strength of the formulation, item 1 was derived from an IRR282 based ferrofluid ($M_S$115 G; viscosity at 27° C. of 115 cPs=0.115 $Nm^{-2}s$) and 29.86% of item 4 was derived from a butane diol diacrylate based ferrofluid ($M_S$ 116 G; viscosity at 27° C. of 12 cPs=0.012 $Nm^{-2}s$). The ferrofluids were prepared by Liquids Research Limited—see Examples 1 and 6. The residual balance of item 4 was derived from pure butane diol diacrylate monomer. The formulation formed a stable colloid when all ingredients were admixed. The magnetic strength of the resulting low viscosity formulation was approximately 50 G. The gold-coated spheres were either exclusively 12, or exclusively 25 micrometres in diameter.

Formulations of this type have been designed to A-stage cure to a handleable solid form which may be either supported or unsupported. In this case the films were unsupported or free standing. The system responsive to photocure is acrylic and reacts independently of the epoxy system, thus forming a network of partially crosslinked polacrylate surrounded by epoxy moieties which are subsequently reacted in the B-stage. The IRR282 resin, being a hybrid epoxy acrylate, serves to knit together the interpenetrating network of acrylic polymer and epoxy polymer after heat activation. Alternatively, the acrylic film forming resins may bear no hybrid epoxy function so that the two systems remain entirely independent after polymerisation in the separate cure cycles. Formulations of the type described in this example, which form a soft film which has unreacted, meltable epoxy monomers interspersed throughout its structure may be used to form anisotropically conductive films with a A-stage cured film thickness greater than the diameter of one conductive filler particle but less than two particle diameters. Because of the softness of the A-staged film and the fact that the epoxy monomers may melt and are unreacted at this stage, conductor pads on substrates to be bonded penetrate through the film until they make contact with the conductive filler particle which lies slightly below the surface of the A-staged film. This process is encouraged by the B-stage cure conditions which require the application of pressure at elevated temperatures which are well in excess of the melting temperatures of the epoxy monomers.

This formulation was used in conjunction with the apparatus described in Example 5 to produce free standing films comprising ordered arrays of conducting particles, said films being capable of subsequent heat activation (B-staging) to produce an adhesive bond. When such films, comprising 25 micrometre gold-coated spheres, were used to bond copper studs to gold-coated FR4 boards, Z-axis contact resistance measurements performed using four point probe methodology indicated resistances in the range 16–22 mOhms. When the same formulation was prepared and films produced comprising particles of identical diameter and core material but with no conductive coating thereon, Z-axis contact resistance measurements indicated electrical open circuits with resistances estimated to be in the order of several hundred kOhms or MOhms.

Silicon die, 36 $mm^2$ in area, were bonded to bare FR4 boards, using said free standing films and 100N force applied for 90 seconds with a bondline temperature of approximately 180° C. The samples were let stand at room temperature before shear testing using an Instron tensile tester with a specially designed sample holder. Die push off strengths of 150N were typical for the above formulation and bonding conditions.

FIG. 10 illustrates an array of squares with 100 micrometre sides, separated by 25 micrometres in both X and Y directions, superimposed on top of an A-staged free standing film prepared from the formulation in the current example. The array of squares simulates an array of similarly sized and positioned electrode pads on a Silicon device, or so-called 'flip chip' device.

The magnetic hole nature of the particles gives rise to a repulsive force when the system is poled with a field oriented normally to the sample plane. This causes the nonmagnetic particles to essentially repel one another and separate which minimises the potential for cross connections between electrode pads superimposed or brought into contact with the film. The mottled grey texture in the figure is due to crystals of DICY (dicyandiamide) embedded in the A staged film. These can be more clearly discerned in FIG. 11. DICY acts as a latent hardener catalyst used to initiate the B-stage cure reactions of the epoxide components of the formulation. The DICY crystals themselves will behave as magnetic holes, albeit irregular ones, and their separation by mutual repulsion, in principle, serves to aid the uniformity of cure through a more uniform dispersion of the curative. The DICY crystals so dispersed do not interfere adversely with the distribution of the conductive magnetic hole spheres as can be seen from FIG. 10 in which the square simulated pads are separated by 25 micrometres in each of the X and Y directions (parallel to the edges of the Figure). DICY may be deployed in the formulation but be removed from the interstial spaces between conductive magnetic hole spheres by first coating said spheres with DICY so that the latent hardener occupies the same position in the formed array as the conductive particle. Heating such a coating above the melting point will cause it to induce cure in the epoxide and flow from the conductive particle. Alternatively, liquid latent hardeners may be used to replace the heterogeneous solid hardeners such as DICY. An example of a latent liquid hardener which does not interfere with the distribution of conductive particles is nadic anhydride (Example 8).

FIG. 10 shows no incidence of cross connection between simulated pad arising from strings or aggregates of particles.

Whereas the acrylic functions in the formulation serve to generate free standing handleable films with latent adhesive properties, and the epoxy functions serve to polymerise during B-stage operations, the dual functional IRR 282 material enters into both types of reaction and serves to tie the epoxy and acrylic systems together.

EXAMPLE 8

A formulation similar to that described in Example 7 was prepared according to the details set out below:

| Reference Number | Component | Percent w/w |
|---|---|---|
| 1 | FF* - Epoxy-Acrylate resin IRR282, ucb Chemicals, Drogenbos, Belgium | 26.8 |
| 2 | Bisphenol F, Dow, US | 12.5 |
| 3 | Irgacure 1700, Ciba-Geigy, UK | 4.5 |
| 4 | Butane diol diacrylate | 20.4 |
| 5 | Nadic Anhydride, Aldrich, UK | 18.36 |
| 6 | HX3722 | 2.5 |
| 7 | Au coated spheres, Sekisui KK, Osaka, Japan | 15.0 |

FF* refers to ferrofluid monomer prepared by Liquids Research Limited - see Examples 1 and 6.

This formulation relies on the liquid latent epoxy curative, Nadic Anhydride. The formulation had a magnetic strength of approximately 31 G. Alignment of conductor particles was facilitated by gentle heating before photocure. Free standing 25 micrometre films were produced after 20 seconds of UV irradiation. Si die 36 mm$^2$ in area were bonded in a B-stage operation on the photocured film which entailed 90 seconds of thermal treatment at 180° C. and 100N force applied to the die with flip-chip bonding equipment ('Fineplacer', FINETECH electronic, Berlin, Germany). Average die shear strengths of 140N were recorded. Electrical measurements in the Z-axis show the film to have 120 mOhm resistance after B-staging.

We claim:

1. An anisotropically-conductive film or a substrate having a surface coated with an anisotropically-conductive coating, said film or coating having been formed by solidifying a solidifiable ferrofluid composition, the solidifiable ferrofluid composition comprising
    (i) a colloidal suspension of ferromagnetic particles in a non-magnetic carrier, and
    (ii) a plurality of electrically-conductive particles dispersed in the ferrofluid composition, said electrically-conductive dispersed particles having an average particle size which is about 10 times or more than the particle size of said ferromagnetic particles,
said electrically-conductive particles having been arrayed in a non-random pattern by application of a substantially uniform magnetic field to the composition in a liquid state and having been locked in position by solidification of the composition.

2. A film or coated substrate according to claim 1 wherein the solidifiable ferrofluid composition was curable and comprised at least a primary cure system which had been activated to solidify said composition.

3. A film or coated substrate according to claim 2 wherein the composition contains a latent cure system which is activatable to further cure said film or coating at a time subsequent to solidification of the composition.

4. A film or coated substrate according to claim 1 wherein the electrically conductive particles have substantially uniform sizes and shapes.

5. A film or coated substrate according to claim 4, wherein said film or coating has a thickness is substantially equal to the average diameter of the electrically-conductive particles.

6. An anisotropically-conductive film or substrate coating formed by
    (a) applying to a substrate, a layer of a solidifiable ferrofluid composition comprising a colloidal suspension of ferromagnetic particles in a non-magnetic carrier liquid, and a plurality of electrically-conductive particles, dispersed in the ferrofluid composition, the electrically-conductive particles having an average particle size about 10 times or more than that of said ferromagnetic particles;
    (b) exposing the solidifiable ferrofluid composition to a magnetic field to array the electrically-conductive particles in a non-random pattern;
    (c) concurrent with or subsequent to step (b), exposing the solidifiable ferrofluid composition to solidifying conditions for the composition; and
    (d) optionally removing the layer of solidified ferrofluid composition from the substrate to form a film.

7. A solid-form anisotropically-conductive film or a substrate having a surface coated with a solid-form anisotropically-conductive coating, said film or coating comprising a composition containing colloidal ferromagnetic particles and a plurality of electrically-conductive particles having an average particle size which is about 10 times or more than that of the ferromagnetic particles arrayed in the composition in a non-random pattern.

8. A film or coated substrate according to claim 7 wherein the composition contains a latent cure system which is activatable to cure said solid-form anisotropically-conductive film or coating.

9. A substrate having conductors thereon, and having an anisotropically conductive film or coating as defined in claim 1 applied to said conductors.

10. A substrate according to claim 9 wherein the anisotropically-conductive coating contains a latent cure system which is activatable to cure said film or coating.

11. A film or coated substrate according to claim 1 wherein the electrically conductive particles are arrayed in a monolayer.

12. A film or substrate coating according to claim 6 wherein the electrically conductive particles are arrayed in a monolayer.

13. A film or coated substrate according to claim 7 wherein the electrically conductive particles are arrayed in a monolayer.

14. A film or coated substrate according to claim 1 wherein the electrically conductive particles are substantially non-magnetic.

15. A film or substrate coating according to claim 6 wherein the electrically conductive particles are substantially non-magnetic.

16. A film or coated substrate according to claim 7 wherein the electrically conductive particles are substantially non-magnetic.

17. A film or coated substrate according to claim 1 wherein the composition contains a latent cure system which is activatable to cure said film or coating at a time subsequent to solidification of the composition.

18. An anisotropically-conductive film or a substrate having a surface coated with an anisotropically-conductive coating, said film or coating having been formed by solidifying a solidifiable ferrofluid composition, the solidifiable ferrofluid composition comprising (i) a colloidal suspension of ferromagnetic particles in a non-magnetic carrier, and (ii) a plurality of electrically-conductive substantially non-magnetic particles dispersed in the ferrofluid composition, said electrically-conductive particles having been arrayed in a non-random pattern by application of a substantially uniform magnetic field to the composition in a liquid state and having been locked in position by solidification of the composition.

* * * * *